United States Patent
Akiba et al.

(10) Patent No.: US 10,128,129 B2
(45) Date of Patent: Nov. 13, 2018

(54) METHOD OF MANUFACTURING SEMICONDUCTOR DEVICE

(71) Applicant: Renesas Electronics Corporation, Koutou-ku, Tokyo (JP)

(72) Inventors: Toshihiko Akiba, Tokyo (JP); Hiromi Shigihara, Tokyo (JP); Kei Yajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/621,226

(22) Filed: Jun. 13, 2017

(65) Prior Publication Data
US 2017/0278722 A1      Sep. 28, 2017

Related U.S. Application Data

(62) Division of application No. 14/886,088, filed on Oct. 18, 2015.

(30) Foreign Application Priority Data

Nov. 7, 2014      (JP) .................................. 2014-227329

(51) Int. Cl.
*H01L 21/48*      (2006.01)
*H01L 23/00*      (2006.01)
(Continued)

(52) U.S. Cl.
CPC ...... *H01L 21/4889* (2013.01); *H01L 21/4846* (2013.01); *H01L 21/4853* (2013.01);
(Continued)

(58) Field of Classification Search
CPC ............. H01L 21/4889; H01L 21/4853; H01L 21/4846; H01L 24/05; H01L 24/03; H01L 22/14
See application file for complete search history.

(56) References Cited

U.S. PATENT DOCUMENTS

| 7,358,608 B2 | 4/2008 | Ohsumi |
| 7,626,271 B2 | 12/2009 | Watanabe |
| 8,101,433 B2 | 1/2012 | Akiba et al. |
| 8,183,147 B2 * | 5/2012 | Koike ..................... H01L 21/56 257/774 |

(Continued)

FOREIGN PATENT DOCUMENTS

| JP | 2005-026678 A | 1/2005 |
| JP | 2005-109427 A | 4/2005 |

(Continued)

OTHER PUBLICATIONS

Extended European Search Report, dated Mar. 24, 2016, in European Patent Application No. 15191412.4.

(Continued)

*Primary Examiner* — Yu-Hsi D Sun
(74) *Attorney, Agent, or Firm* — Shapiro, Gabor and Rosenberger, PLLC

(57) ABSTRACT

Provided is a semiconductor device with improved reliability that achieves the reduction in size. A semiconductor wafer is provided that has a first insulating member with an opening that exposes from which an upper surface of an electrode pad. Subsequently, after forming a second insulating member over a main surface of the semiconductor wafer, another opening is formed to expose the upper surface of the electrode pad. Then, a probe needle is brought into contact with the electrode pad, to write data in a memory circuit at the main surface of the semiconductor wafer. After covering the upper surface of the electrode pad with a conductive cover film, a relocation wiring is formed. In the Y direction, the width of the relocation wiring positioned directly above the electrode pad is equal to or smaller than the width of the opening formed in the first insulating member.

9 Claims, 30 Drawing Sheets

(51) Int. Cl.
*H01L 23/31* (2006.01)
*H01L 23/538* (2006.01)
*H01L 23/498* (2006.01)
*H01L 23/525* (2006.01)

(52) U.S. Cl.
CPC ...... *H01L 23/3114* (2013.01); *H01L 23/5384* (2013.01); *H01L 23/5389* (2013.01); *H01L 24/03* (2013.01); *H01L 24/05* (2013.01); *H01L 24/19* (2013.01); *H01L 24/20* (2013.01); *H01L 23/49816* (2013.01); *H01L 23/525* (2013.01); *H01L 2224/03* (2013.01); *H01L 2224/0401* (2013.01); *H01L 2224/04042* (2013.01); *H01L 2224/04105* (2013.01); *H01L 2224/11* (2013.01); *H01L 2224/32225* (2013.01); *H01L 2224/45144* (2013.01); *H01L 2224/48091* (2013.01); *H01L 2224/48227* (2013.01); *H01L 2224/48465* (2013.01); *H01L 2224/73265* (2013.01); *H01L 2224/73267* (2013.01); *H01L 2224/94* (2013.01); *H01L 2924/15311* (2013.01); *H01L 2924/181* (2013.01)

(56) References Cited

U.S. PATENT DOCUMENTS

| | | | |
|---|---|---|---|
| 9,312,213 | B2 | 4/2016 | Cho et al. |
| 2001/0023981 | A1* | 9/2001 | Ikumo .................. H01L 23/522 257/678 |
| 2004/0238951 | A1 | 12/2004 | Kobayashi et al. |
| 2007/0126030 | A1 | 6/2007 | Ito |
| 2009/0243118 | A1 | 10/2009 | Akiba et al. |
| 2011/0198753 | A1 | 8/2011 | Holland |

FOREIGN PATENT DOCUMENTS

| | | |
|---|---|---|
| JP | 2007-157879 A | 6/2007 |
| JP | 2008-021936 A | 1/2008 |
| JP | 2009-246218 A | 10/2009 |
| JP | 2014-068015 A | 4/2014 |

OTHER PUBLICATIONS

Office Action, dated Jan. 9, 2018, in Japanese Patent Application No. 2014-227329.

* cited by examiner

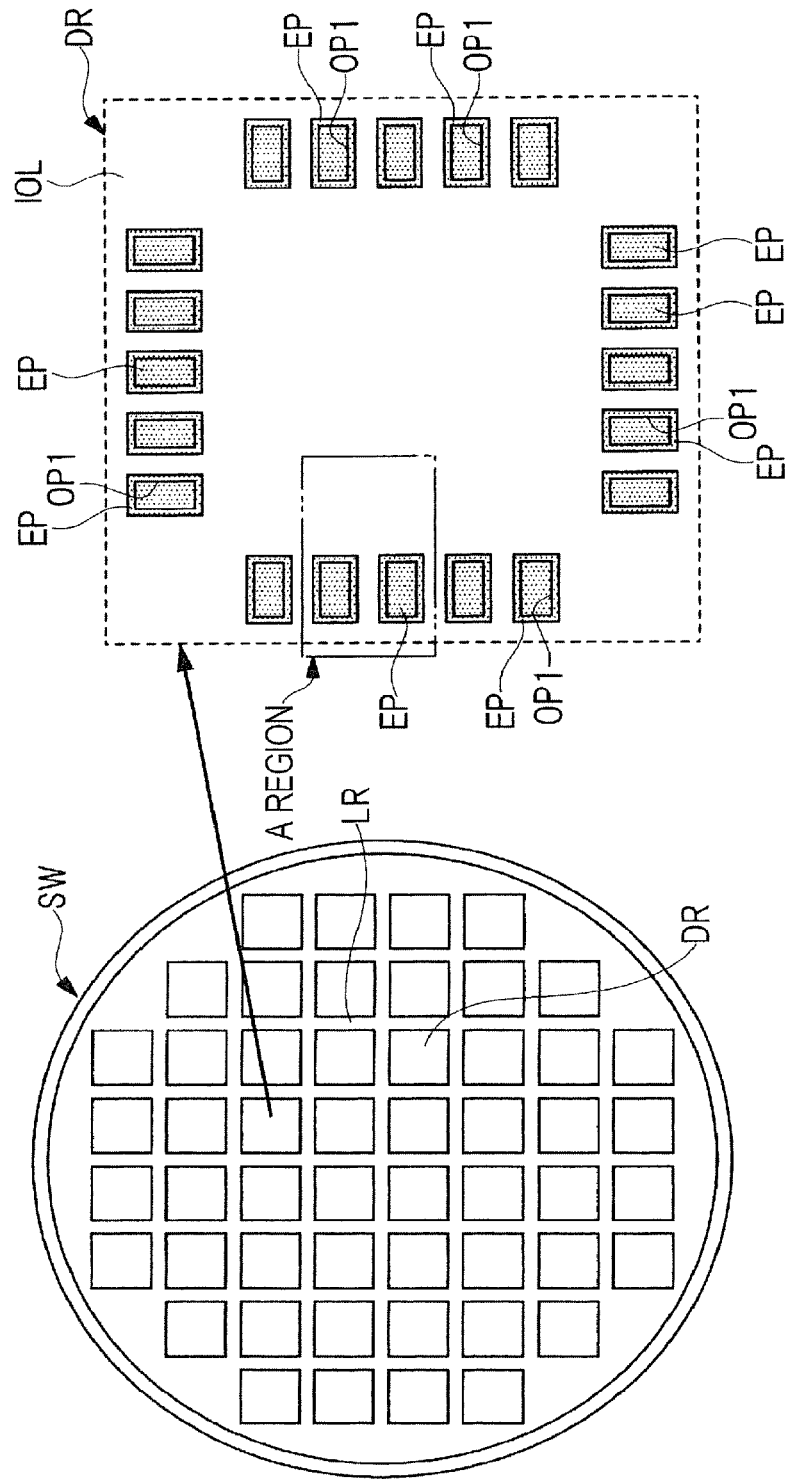

METHOD OF MANUFACTURING SEMICONDUCTOR DEVICE

CROSS-REFERENCE TO RELATED APPLICATIONS

The disclosure of Japanese Patent Application No. 2014-227329 filed on Nov. 7, 2014 including the specification, drawings and abstract is incorporated herein by reference in its entirety.

BACKGROUND

The present invention relates to a technique for manufacturing semiconductor devices, and more particularly, a technique suitable for use in manufacture of a semiconductor device which includes wirings coupled to electrode pads of a semiconductor chip.

The background art of a wafer process package (WPP) or a wafer level package (WLP), which belongs to the technical field of the present invention, is disclosed in, for example, Japanese Unexamined Patent Application Publications No. 2009-246218, No. 2008-021936, and No. 2007-157879.

Japanese Unexamined Patent Application Publication No. 2009-246218 (Patent Document 1) describes a semiconductor device and a manufacturing method thereof, in which pads are provided over a semiconductor chip, each pad having a probe region and a coupling region. In the semiconductor device, a probe mark exists at the pad in the probe region positioned on the outer peripheral side of the semiconductor chip with respect to the coupling region, and a rewiring is formed to extend from the coupling region toward the center side of the semiconductor chip.

Japanese Unexamined Patent Application Publication No. 2008-021936 (Patent Document 2) describes another semiconductor device and manufacturing method thereof. The semiconductor device is comprised of a rewiring layer including a wiring pattern having a linear portion and a post electrode mounting portion, a post electrode provided over the post electrode mounting portion, and an external terminal mounted over a top surface of the post electrode. The post electrode has its button surface with an outline intersecting at least two points of an outline of an upper surface of the post electrode mounting portion.

Japanese Unexamined Patent Application Publication No. 2007-157879 (Patent Document 3) describes a further semiconductor device and manufacturing method thereof, in which a plating underlayer is formed by electroless plating to be coupled to a terminal electrode, and at least a part of a rewiring layer coupled to the plating underlayer over the terminal electrode is formed of a plated layer.

SUMMARY

In recent years, with enhancing functionality and increasing speed of semiconductor devices, the number of electrode pads provided in the semiconductor chip has tended to be increased. On the other hand, there is currently a need for semiconductor devices with reduced size, and hence a pitch (interval) between the adjacent electrode pads has tended to be decreased.

From this aspect, it is considered to be effective to couple another new wiring (relocation wiring, rewiring) to the electrode pad provided at the semiconductor chip, as disclosed in Patent Documents 1 to 3 described above. However, the inventors have found out that this way might cause various problems depending on semiconductor chips in use, that is, the specifications of products in terms of ensuring the reliability of the semiconductor chip or product.

Other problems and new features of the present invention will be clearly understood by the following detailed description of the present specification in connection with the accompanying drawings.

In a method of manufacturing a semiconductor device according to one embodiment, first, a semiconductor wafer is provided which includes, at its upper surface, a first electrode pad, a second electrode pad arranged next to the first electrode pad in a plan view, and a first insulating member having a first opening that exposes from which an upper surface of the first electrode pad and a second opening that exposes from which an upper surface of the second electrode pad. Subsequently, after forming a second insulating member over the first insulating member of the semiconductor wafer, a third opening that exposes from which the upper surface of the first electrode pad and a fourth opening that exposes from which the upper surface of the second electrode pad are formed in the second insulating member. Then, the upper surface of the first electrode pad and the upper surface of the second electrode pad are covered with a first cover film and a second cover film, respectively. Thereafter, a first wiring and a second wiring are formed over a surface of the first cover film and a surface of the second cover film, respectively. Subsequently, after covering the surface of the first cover film, the surface of the second cover film, and the first wiring and the second wiring with a third insulating member, a fifth opening that exposes from which a part of the first wiring and a sixth opening that exposes from which a part of the second wiring are formed in the third insulating member. Here, the first electrode pad and the second electrode pad are arranged along a first direction in the plan view. Each of the first cover film and the second cover film includes a conductive material. The width of the first wiring in the first direction is equal to or smaller than the width of the third opening formed in the second insulating member. The width of the second wiring in the first direction is equal to or smaller than the width of the fourth opening formed in the second insulating member.

Accordingly, the one embodiment of the invention can improve the reliability of the semiconductor device while achieving the reduction in size of the semiconductor device.

BRIEF DESCRIPTION OF THE DRAWINGS

FIG. 4A is a plan view showing a main part of a semiconductor wafer in the one embodiment; FIG. 4B is an enlarged plan view showing a main part of one semiconductor chip in the semiconductor wafer in the one embodiment;

DETAILED DESCRIPTION

Figure 1:
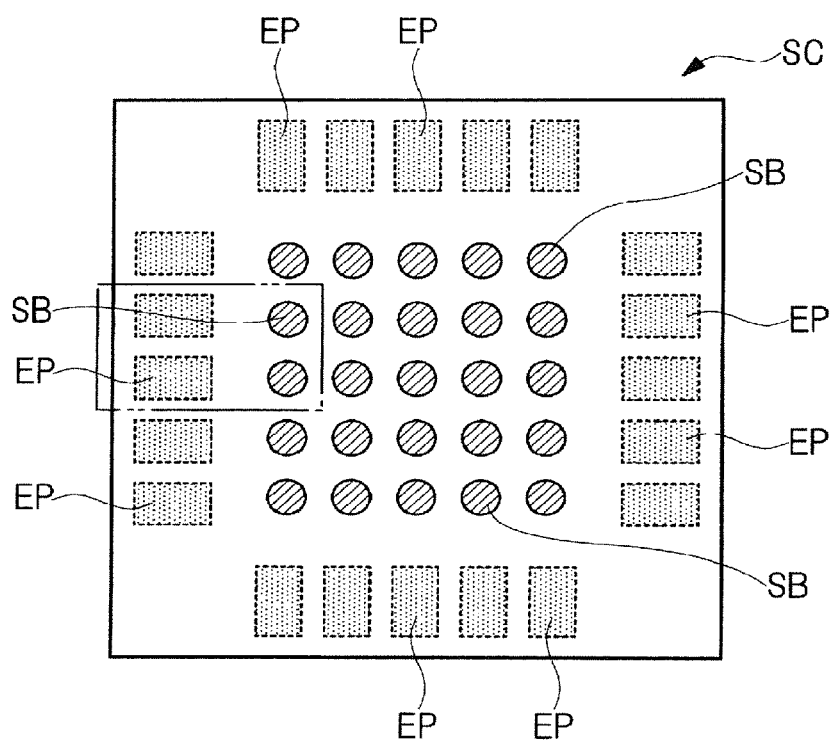
FIG. 1 is a schematic diagram showing the plane of a semiconductor device according to one embodiment of the invention.

The following preferred embodiments of the invention may be described below by being divided into a plurality of sections or embodiments for convenience, if necessary, which are not independent from each other, unless otherwise specified. One of the sections or embodiments may be a modified example, a detailed description, supplementary explanation, and the like of a part or all of the other.

Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when clearly limited to the specific number in principle.

It is obvious that the components (including steps) in the following embodiments are not necessarily essential unless otherwise specified, and except when clearly considered to be essential in principle.

The expressions "comprised of A", "formed of A", "having A", and "including A" as described herein does not exclude elements other than the element A, unless otherwise specified. Likewise, when referring to the shape of one component, or the positional relationship between the components and the like in the following embodiments, any shape or positional relationship substantially similar or approximate to that described herein may be included in the invention unless otherwise specified and except when clearly considered not to be so in principle. The same goes for the above numerical value and the range.

In the accompanying drawings used for description of the following embodiments, some plan views are hatched for better understanding. In all these drawings for explaining the embodiments below, the parts having the same function are indicated by the same reference character in principle, and its description will not be repeated. In the following embodiments, the direction in which a relocation wiring extends directly above an electrode pad is defined as "the X direction", and the direction intersecting the X direction at the main surface of a semiconductor wafer (particularly, directly above the electrode pad) is defined as "the Y direction".

Some embodiments of the present invention will be described in detail below based on the accompanying drawings.

DETAILED DESCRIPTION OF PROBLEMS

To clarify the manufacturing method of the semiconductor device in this embodiment, first, a detailed description will be given of the problems of the wafer process package technique to be solved that have been found out by the inventors.

A pitch conversion of electrode pads by the wafer process package technique is effective as a mean for pitch reduction in the semiconductor device. The wafer process package technique is a technique that integrates a normal wafer process (pre-process) and a package process (post-process). After completion of packaging in the state of a semiconductor wafer, the wafer is singulated into semiconductor chips. In the wafer process package technique, the electrode pads are formed at a narrow pitch over the main surface of the semiconductor wafer, and relocation wirings (wiring, rewiring) are formed to be electrically coupled to the electrode pads, so that the narrow pitch between the electrode pads can be converted into a wider pitch.

The inventors have studied that after writing data in a memory circuit formed at the main surface of the semiconductor wafer, the relocation wirings are formed over the main surface of the semiconductor wafer.

(1) First, the inventors have studied about a semiconductor wafer including its main surface covered with an inorganic insulating film (e.g., a silicon oxide ($SiO_2$) film or a silicon nitride ($Si_3N_4$) film). The semiconductor wafer has electrode pads electrically coupled to a memory circuit. The upper surface of the electrode pad (that will be a surface to come into contact with a probe needle later) is exposed on the inner side of an end of an opening formed in the inorganic insulating film.

However, in such a semiconductor wafer, when a relocation wiring is formed to be electrically coupled to the electrode pad, the formation of the relocation wiring directly above the inorganic insulating film might cause damage (for example, disconnection, cracks, etc.,) to the relocation wiring itself or a layer positioned under (as a lower layer to) the relocation wiring (wiring layer or insulating layer including the above-mentioned inorganic insulating film, etc.,) and the like due to stress and the like in mounting (assembly) or in the actual usage environment. Further, if the thickness of the formed inorganic insulating film is thin, it is difficult to maintain an appropriate capacity between a wiring positioned under the inorganic insulating film (as a lower layer) and a relocation wiring formed over the inorganic insulating film, whereby the desired electric characteristics might not be obtained due to the influence of noise. To prevent these disadvantages, for example, as disclosed in the above-mentioned Patent Document 1, a relocation wiring is desirably formed over the inorganic insulating film via an organic insulating film (for example, made of a polyimide film and the like).

(2) Next, the inventors have considered that data is written in a memory circuit on the semiconductor wafer with the inorganic insulating film formed thereat, and then an organic insulating film is formed over the inorganic insulating film, followed by forming the relocation wiring on the organic insulating film. As a result, it has been revealed that the date written in the memory circuit might disappear. As the causes for this are analyzed by the inventors, it is found out that this phenomenon is influenced by a heating temperature of a heat treatment performed in hardening the organic insulating film (e.g., approximately 300° C. to 400° C.)

(3) Furthermore, the inventors have studied that an organic insulating film is first formed over the main surface of a semiconductor wafer with an inorganic insulating film formed thereat, and then hardened by a heat treatment, followed by writing data in a memory circuit, and finally a relocation wiring is formed over the organic insulating film.

Figure 30A:
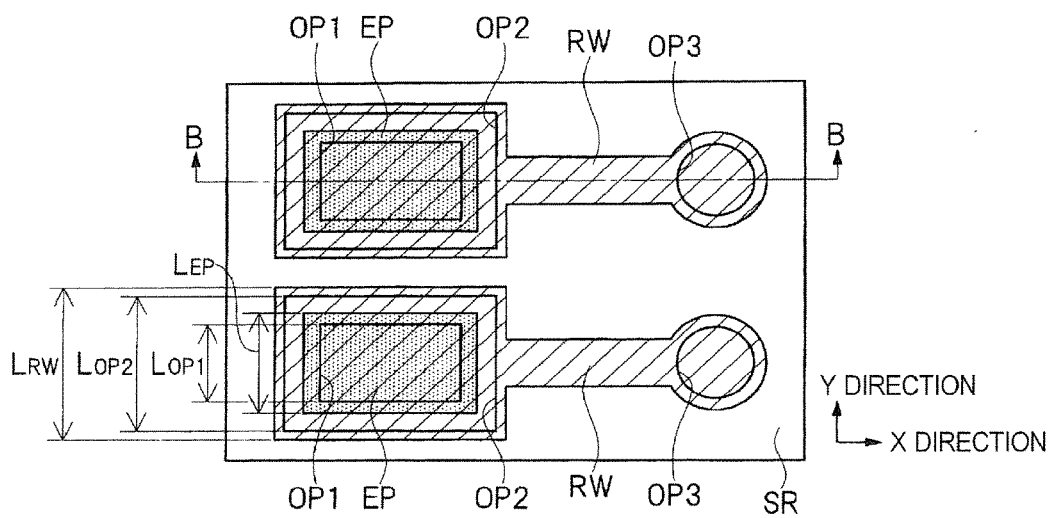
FIG. 30A is an enlarged plan view showing a main part of the semiconductor device that has been studied by the inventors (which is a translucent plan view through an insulating member (third insulating member) covering relocation wirings)
Figure 30B:
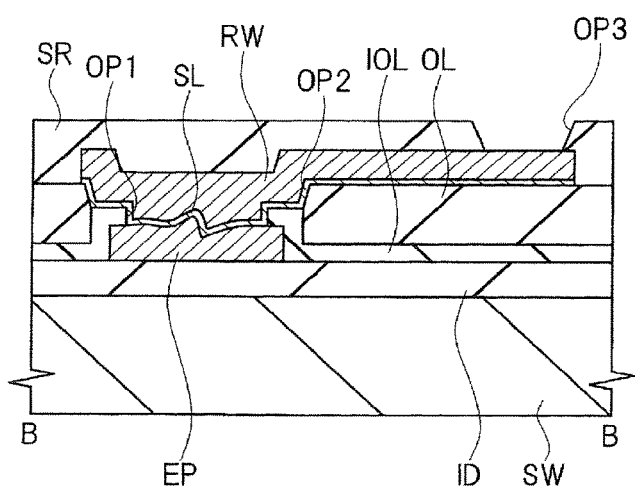
FIG. 30B is a cross-sectional view showing a main part taken along the line B-B of FIG. 30A.

FIGS. 30A and 30B are a plan view and a cross-sectional view of a main part of the semiconductor device, respectively, that has been studied by the inventors. Specifically, FIG. 30A is a transparent plan view through the insulating member (third insulating member) covering the relocation wiring, as viewed from the main surface side of the semiconductor wafer. FIG. 30B is a cross-sectional view taken along the line B-B of FIG. 30A.

A second insulating member OL is formed over the main surface of a semiconductor wafer SW with a first insulating member IOL formed thereat. After hardening the second insulating member OL by the heat treatment, data can be written in the memory circuit, thereby preventing loss of data.

The data is written by bringing a probe needle into contact with an upper surface of an electrode pad EP that is exposed at the inner side of an opening end of an opening OP1 formed in the first insulating member IOL as well as the inner side of an opening end of an opening OP2 formed in the second insulating member OL. Since the second insulating member OL is semi-transparent, it is difficult to specify the position where the probe needle is to contact, if the opening end of the opening OP2 of the second insulating member OL is placed inside the opening end of the opening OP1 of the first insulating member IOL.

Considering the easiness to write data, the opening OP2 formed in the second insulating member OL is preferably set larger than the opening OP1 formed in the first insulating member IOL so as to surely expose the inside of the opening end of the opening OP1 formed in the first insulating member IOL. That is, preferably, the opening end of the opening OP2 of the second insulating member OL is aligned with the opening end of the opening OP1 of the first insulating member IOL, or is positioned outside the opening end of the opening OP1 of the first insulating member IOL.

However, if the opening end of the opening OP2 of the second insulating member OL is aligned with the opening end of the opening OP1 of the first insulating member IOL, or is positioned outside the opening end of the opening OP1 of the first insulating member IOL, a width $L_{RW}$ of a relocation wiring RW might become large.

In detail, suppose the upper surface of the electrode pad EP is exposed when the electrode pad EP is made of, for example, aluminum (Al). In this case, the electrode pad EP is more likely to become deteriorated (to be subject to corrosion or to have its shape changed, or the like), when forming the relocation wiring RW using wet etching or dry etching, specifically, when removing an unnecessary part of a seed layer by using an etchant. If the upper surface of the electrode pad EP made of, e.g. aluminum (Al) is exposed, the third insulating member SR covering the relocation wiring RW to be formed later comes into direct contact with (or adheres to) the electrode pad EP. In such a case, when a complete product (semiconductor chip) is exposed, for example, under an atmosphere at high temperature and high humidity, the electrode pad EP might become deteriorated (subject to corrosion or the like), leading to failure of electrical characteristics.

(4) Then, the inventors formed the relocation wiring RW such that the width $L_{RW}$ of the relocation wiring RW is set larger than that of each of a width $L_{OP1}$ of the opening OP1 formed in the first insulating member IOL and a width $L_{OP2}$ of the opening OP2 formed in the second insulating member OL not to expose the electrode pad EP. However, in this case, it is difficult to decrease a pitch (interval) between the adjacent electrode pads EP, that is, to enable the pitch reduction. This cannot reduce the size of the semiconductor device, or cannot increase the pin count.

Note that to decrease the pitch (interval) between the adjacent electrode pads EP, the width $L_{RW}$ of the relocation wiring RW over the electrode pad EP should be set smaller than the width $L_{EP}$ of the electrode pad EP, for example, as described in Patent Document 2. In this case, however, as described above, the upper surface of the electrode pad EP is partly exposed. For example, if the relocation wiring RW is formed using the etchant, the electrode pad might become deteriorated (might be subject to corrosion, or might have its shape changed, or the like). As a result, the insulating member covering the relocation wirings RW, namely, the third insulating member SR might be peeled from the surface of the electrode pad EP.

Preferred Embodiments

<<Semiconductor Device>>

Figure 2A:
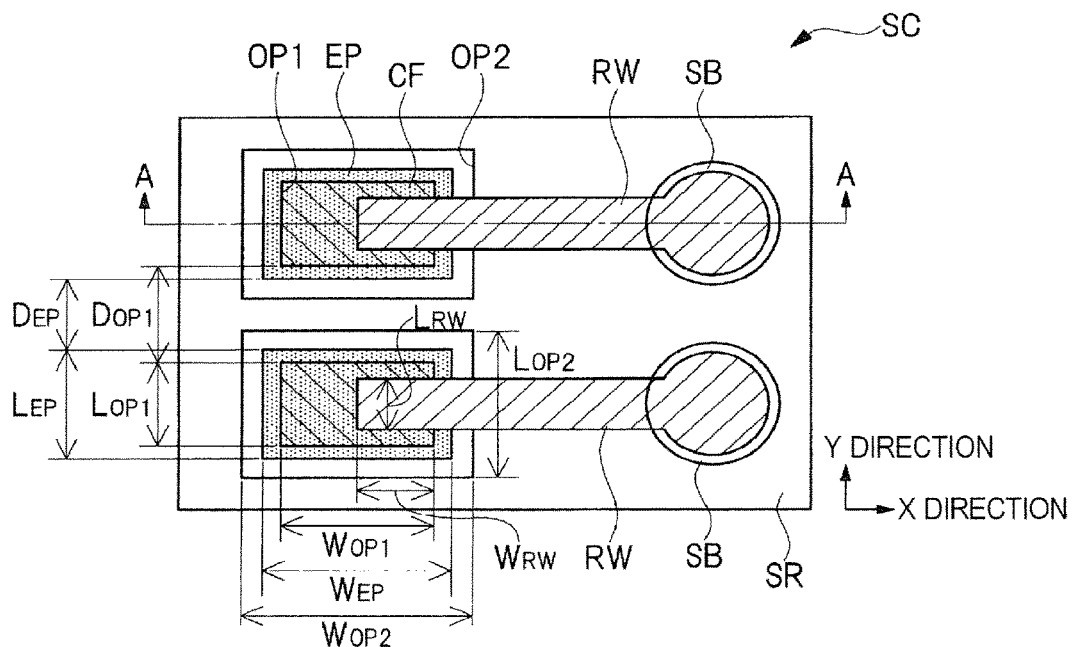
FIG. 2A is an enlarged plan view showing a main part of the semiconductor device in the one embodiment (which is a translucent plan view through an insulating member (third insulating member) covering relocation wirings and bump electrodes.
Figure 2B:
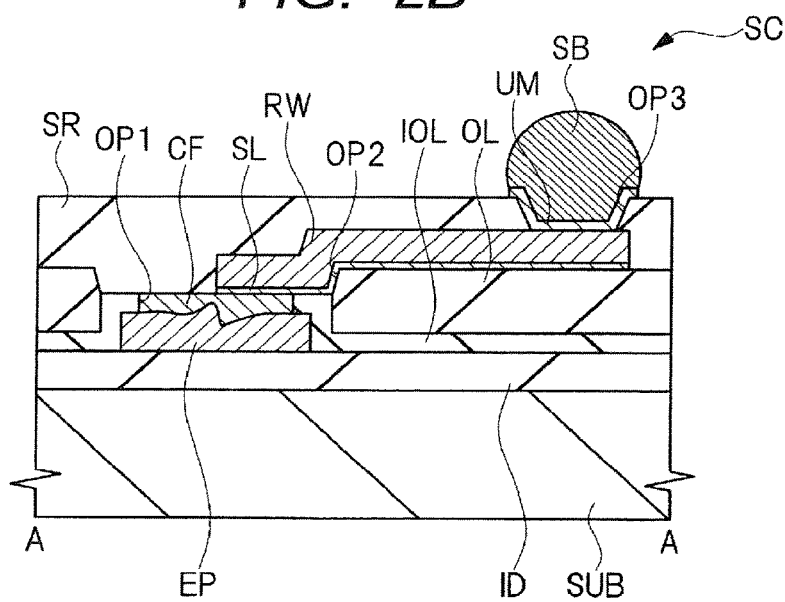
FIG. 2B is a cross-sectional view of a main part taken along the line A-A of FIG. 2A.

The structure of a semiconductor device in one embodiment will be described below with reference to FIGS. 1 and 2A and 2B. FIG. 1 is a schematic diagram showing the plane of the semiconductor device in this embodiment of the invention. FIGS. 2A and 2B are an enlarged plan view and an enlarged cross-sectional view, respectively, showing a main part of the semiconductor device in this embodiment. FIG. 2B is the cross-sectional view taken along the line A-A of FIG. 2A.

In this embodiment, as shown in FIG. 1, a plurality of ball-shaped bump electrodes (solder balls) SB are arranged in matrix at the center of a semiconductor device (semiconductor chip) SC. The bump electrodes SB are provided as external terminals of the semiconductor device SC to protrude from an insulating member serving as a surface protective film.

A plurality of electrode pads (surface electrodes) EP electrically coupled to wiring configuring the semiconductor circuit are provided at the outer periphery of the semiconductor device SC. Further, each of the electrode pads EP is electrically coupled to the corresponding bump electrode SB via the relocation wiring (not shown). The electrode pads EP and the relocation wirings are covered with the insulating member. Since the electrode pads EP are actually covered with the insulating member, the electrode pads EP are represented by dotted lines in FIG. 1.

The semiconductor circuit (not shown) is provided at the main surface (element formation surface) of the rectangular semiconductor device SC. The semiconductor circuit is formed by the well-known technique in the so-called preprocess (normal wafer process). The semiconductor circuit is comprised of, for example, various semiconductor elements, including a field-effect transistor, a resistor, and a capacitance, which are formed at the main surface, wirings (wiring layers) electrically coupled to these semiconductor elements and formed over the main surface, and an insulating layer and the like positioned between the wirings (wiring layers) or over and/or under the wiring (wiring layer). Note that the insulating layer is a film made of a low permittivity material, such as a silicon oxycarbide film (SiOC), which is a silicon oxide film with carbon added thereto.

Now, referring to FIGS. 2A and 2B, the structures of the bump electrode, the electrode pad, and the relocation wiring will be described in detail. FIG. 2A illustrates only two adjacent ones of the electrode pads (a region enclosed by a chain double-dashed line shown in FIG. 1). The peripheral edge of each of the electrode pads is covered with the insulating member. However, in the plan view for the electrode pads from the main surface side of the semiconductor wafer, the peripheral edge of each of the electrode pads is represented by a solid line. FIG. 2A is a transparent plan view through the insulating member (third insulating member) covering the relocation wiring and the bump electrode, as viewed from the main surface side of the semiconductor wafer. A layer denoted by reference character ID in FIG. 2B is an interlayer insulating film provided under the electrode pads.

The width $W_{EP}$ of the electrode pad EP is, for example, approximately 102 μm in the direction in which the relocation wiring (wiring, rewiring) RW extends directly above the electrode pad EP (hereinafter referred to as, for example, the "X direction" in this embodiment). A width $L_{EP}$ of the electrode pad EP in the direction intersecting the X direction (hereinafter referred to as, for example, the "Y direction" in this embodiment) in a plan view (in the plan state viewed from the main surface side of the semiconductor substrate SUB) is, for example, approximately 47 μm. A interval $D_{EP}$ between two adjacent electrode pads EP is, for example, approximately 3 μm. In this embodiment, the electrode pads EP are arranged (arranged in line) along the side of (the side closest to) the semiconductor chip. As viewed by using the relocation wiring RW as the reference, it can be said that the electrodes EP are arranged (arranged in line) along the above-mentioned Y direction. In this embodiment, the X direction and the Y direction are perpendicular to each other. The above-mentioned X direction is the direction in which the relocation wiring RW extends directly above the electrode pad EP.

The probe needle is brought into contact with each of these electrode pads EP to write data in the memory circuit formed at the main surface of the semiconductor substrate SUB or to perform a screening test for initial failure or the like of the memory circuit.

The first insulating member (a first insulating film, an insulating film with a first elastic modulus, a first passivation film) IOL is formed over the main surface of the semiconductor substrate SUB to cover the electrode pads EP. The first insulating member IOL is an inorganic insulating film, and made of, for example, a silicon oxynitride (SiON) film, silicon oxide ($SiO_2$) film, a silicon nitride ($Si_3N_4$) film, etc. The thickness of the first insulating member IOL is, for example, in a range of 0.6 μm to 0.8 μm. A Young's modulus of the silicon nitride ($Si_3N_4$) film is, for example, in a range of approximately 250 GPa to 300 GPa.

The opening OP1 is formed in the first insulating member IOL to expose the upper surface of the electrode pad EP therefrom. The width $W_{OP1}$ of the opening OP1 in the X direction is, for example, approximately 100 μm. The width $L_{OP1}$ of the opening OP1 in the Y direction is, for example, approximately 45 μm. The interval $D_{OP1}$ between the openings OP1 is, for example, approximately 5 μm.

The second insulating member (a second insulating film, an insulating film with a second elastic modulus, a second passivation film) OL is formed over the first insulating member IOL. The second insulating member OL is an organic insulating film, for example, a polyimide film etc. The thickness of the second insulating member OL is, for example, approximately 5 μm. The elastic modulus of the second insulating member OL is lower than that of the first insulating member IOL. For example, an Young's modulus of the polyimide film is in a range of approximately 3 GPa to 7 GPa.

The opening OP2 is formed in the second insulating member IOL to expose the upper surface of the electrode pad EP therefrom. The width $W_{OP2}$ of the opening OP2 formed in the second insulating member OL in the X direction is equal to or larger than the width $W_{OP1}$ of the opening OP1 formed in the first insulating member IOL. The width $L_{OP2}$ of the opening OP2 in the Y direction is equal to or larger than the width $L_{OP1}$ of the opening OP1 formed in the first insulating member IOL.

In this embodiment, a cover film (conductive member) CF is formed to fill the inside of the opening end of the opening OP1 formed in the first insulating member IOL. Note that the position where the cover film CF is formed is not limited thereto. For example, the cover film may be formed to fill the inside of the opening OP2 formed in the second insulating member OL. Once the cover film CF is formed up to the second insulating member OL, as shown in FIGS. 30A and 30B considered by the inventors, it is difficult to reduce the pitch (interval) between the adjacent electrode pads EP. When the thickness of the second insulating member OL positioned between the adjacent electrode pads EP (length in the Y direction) is thin, and different signals (or currents) from each other flow through the respective electrode pads EP, the semiconductor chip might be affected by noise. From this aspect, when considering the reduction in pitch between the electrode pads EP, as shown in FIGS. 2A and 2B, the cover film CF is preferably formed to be positioned within the opening end of the opening OP1 formed in the first insulating member IOL.

In this embodiment, the relocation wiring RW is formed over the second insulating member OL. The relocation wiring has one end thereof electrically coupled to the cover film CF, and the other end thereof (bump land, or bonding pad) derived from the center side of the semiconductor device SC. Under the relocation wiring RW, a seed layer SL is formed to serve as a seed in forming the relocation wiring RW. The relocation wiring RW is made, for example, of copper (Cu), and has a thickness, for example, of approximately 5 μm. The seed layer SL is comprised of a laminated film, for example, obtained by stacking a titanium (Ti) film and a copper (Cu) film from the bottom in this order. The thickness (total thickness) of the seed layer SL is, for example, approximately 0.3 μm. Specifically, the thickness of the titanium (Ti) film is about 0.2 μm, and the thickness of the copper (Cu) film is about 0.1 μm.

A width $W_{RW}$ of a part of the relocation wiring RW positioned directly above the electrode pad EP in the X direction is equal to or smaller than a width $W_{OP1}$ of the opening OP1 formed in the first insulating member IOL, or a width (length) of the cover film CF. A width $L_{RW}$ of a part of the relocation wiring RW positioned directly above the electrode pad EP in the Y direction is equal to or smaller than a width $L_{OP1}$ of the opening OP1 formed in the first insulting member IOL, or the width (length) of the cover film CF.

In this way, in the Y direction (in the direction in which the electrode pads EP are arranged in line, or the direction along the side of the semiconductor chip), the width $L_{RW}$ of the relocation wiring RW positioned directly above the electrode pad EP is equal to or smaller than the width $L_{OP1}$ of the opening OP1 formed in the first insulating member IOL, or the width (length) of the cover film CF, thereby preventing the contact between the relocation wirings RW next to each other in the Y direction. With this arrangement, the reduction in pitch between the electrode pads EP can be attained, thereby achieving the reduction in size of the semiconductor device.

As mentioned above, in the description of this embodiment, in the Y direction, the width $L_{RW}$ of the relocation wiring RW is equal to or smaller than the width $L_{OP1}$ of the opening OP1 formed in the first insulating member IOL, or the width (length) of the cover film CF. However, alternatively, the width $L_{RW}$ of the relocation wiring RW may be equal to or smaller than the width $L_{OP2}$ of the opening OP2 formed in the second insulating member OL. Note that the relocation wiring RW could be displaced from a desired position. Further, when copper (Cu) is used as material for the relocation wiring RW, the problem of migration is more likely to occur, as the interval (distance) between the adjacent relocation wirings RW is decreased. For this reason, considering the above-mentioned problem, like this embodiment, the width $L_{RW}$ of the relocation wiring RW is preferably formed to be equal to or smaller than the width $L_{OP1}$ of the opening OP1 formed in the first insulating member IOL, or the width (length) of the cover film CF.

A third insulating member (a third insulating film, a third passivation film, an organic material, resin) SR is formed over the main surface of the semiconductor substrate SUB to cover the relocation wirings RW. The third insulating member SR is an organic insulating film, for example, a polyimide film as a specific material.

Openings OP3 are formed in the third insulating member SR to expose the upper surface of the other end of each relocation wiring RW derived toward the center side of the semiconductor device SC. The other end of the relocation wiring RW exposed from the opening OP3 is coupled to the ball-shaped bump electrode SB via an electrode layer (electrode) UM. That is, the electrode pad EP is electrically coupled to the bump electrode SB via the cover film CF and the relocation wiring RW. The bump electrodes SB are provided as the external terminals of the semiconductor device SC to protrude from the third insulating member SR.

<<Method of Manufacturing Semiconductor Device>>

Figure 3:
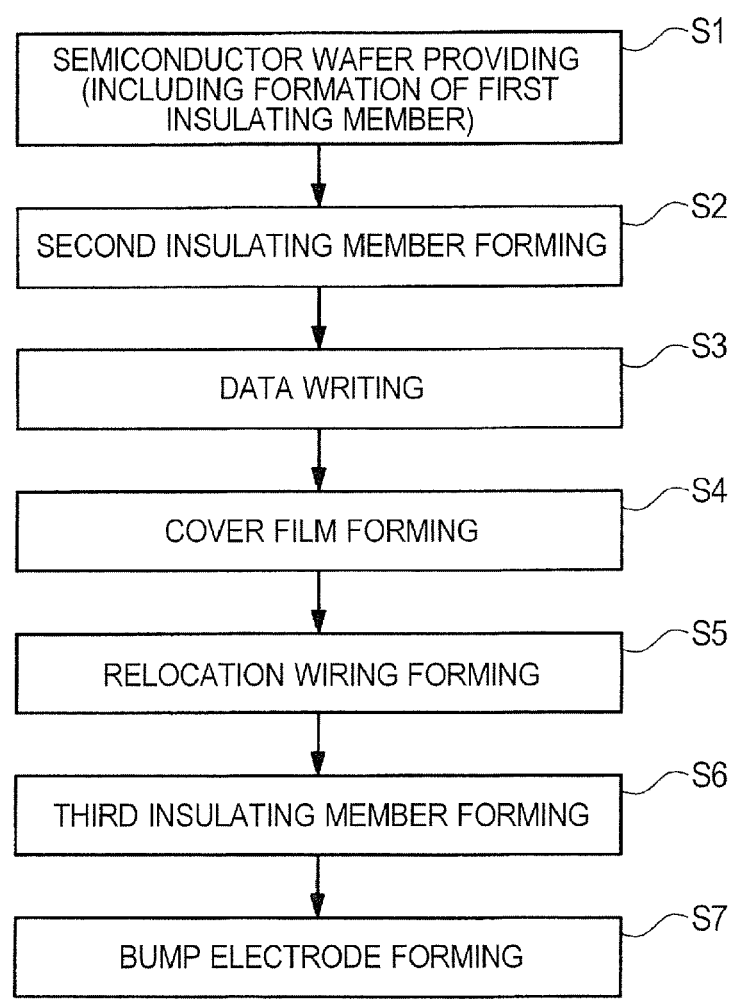
FIG. 3 is a flowchart showing one example of the flow of manufacturing processes in a manufacturing method of the semiconductor device according to one embodiment.

The method of manufacturing the semiconductor device in this embodiment will be described below in the order of processes with reference to FIGS. 3 to 14. FIG. 3 shows a flowchart of one example of the flow of manufacturing processes in the manufacturing method of the semiconductor device in this embodiment. FIG. 4A is a plan view showing a main part of a semiconductor wafer, and FIG. 4B is an enlarged plan view showing a main part of one semiconductor chip in the semiconductor wafer in this embodiment. FIGS. 5A and 5B to 13A and 13B are enlarged plan views and enlarged cross-sectional views, respectively, each showing a main part of the semiconductor device obtained in the corresponding manufacturing process for the semiconductor device in this embodiment. FIG. 14 shows a cross-sectional view of a main part of the semiconductor device obtained in the manufacturing process for the semiconductor device in this embodiment.

Note that FIGS. 5A to 13A illustrate only the two adjacent ones of the electrode pads (an A region enclosed by a chain double-dashed line shown in FIG. 4B). The peripheral edge of each of the electrode pads is covered with the insulating member. However, in the plane view for the electrode pads from the main surface side of the semiconductor wafer, the peripheral edge of each of the electrode pads is represented by a solid line.

1. Semiconductor Wafer Provision (Step S1)

First, as shown in FIG. 4A, the semiconductor wafer SW is provided which has a plurality of device regions (chip formation regions) DR with various semiconductor circuits formed therein. Various semiconductor elements, such as a field-effect transistor, a resistor, and a capacitor, are formed at the main surface of the semiconductor wafer SW. These elements are electrically coupled together via the above-mentioned wirings (wiring layers), whereby various semiconductor circuits, including a memory circuit, are formed in the respective device regions DR. The semiconductor wafer SW is, for example, a silicon (Si) substrate having a substantially circular plan shape. Note that the semiconductor wafer SW may be not only a silicon (Si) substrate, but also a compound semiconductor substrate, such as a gallium-arsenic (GaAs) substrate and a silicon carbide (SiC) substrate.

As shown in FIG. 4B, in each device region DR, the electrode pads EP are formed around the outer perimeter of the device region DR. The electrode pads EP are electrically coupled to various semiconductor circuits, such as a memory circuit, formed at the main surface of the semiconductor wafer SW, via the wirings. Each of the electrode pads EP is formed, for example, in a rectangular shape that has a long side extending from the outer peripheral side of the device region DR toward the center side thereof. The electrode pad EP has the structure, for example, that includes a main conductive layer made of an aluminum (Al) film, and conductive films with barrier properties vertically sandwiching the main conductive layer therebetween. Each conductive film is comprised of a laminated film of a titanium (Ti) film and a titanium nitride (TiN) film. The thickness of each of the electrode pads EP is, for example, in a range of approximately 0.4 μm to 6.0 μm. The typical thickness of the electrode pad EP can be approximately 1.0 μm by way of example.

FIG. 4A illustrates a scribe region (dicing region) LR. In this stage, the semiconductor wafer SW is cut along the scribe region LR, whereby the semiconductor chips can be obtained. In this embodiment, the following processes to be further described later are performed on the wafer, and then the wafer is singulated, so that the semiconductor chips produced can also be used as semiconductor devices.

Now, the technical features of this embodiment will be described by taking two adjacent ones of the electrode pads EP as one example.

Figure 5A:
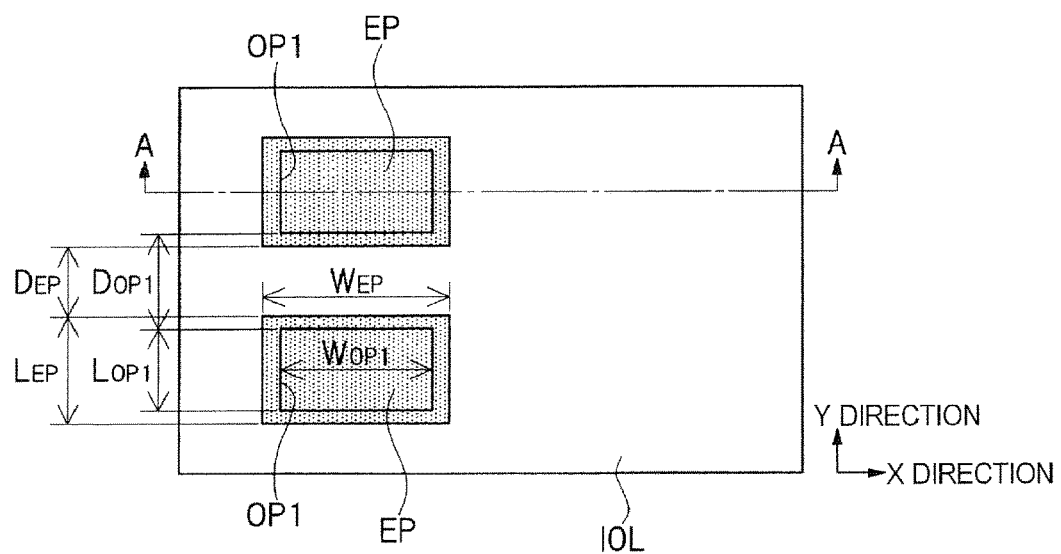
FIGS. 5A and 5B are an enlarged plan view and an enlarged cross-sectional view, respectively, showing a main part of the semiconductor device obtained in a manufacturing process for the semiconductor device in the one embodiment.

FIG. 5A is an enlarged plan view showing two adjacent ones of the electrode pads EP. The width $W_{EP}$ of the electrode pad EP in the X direction is, for example, approximately, 102 μm. The width $L_{EP}$ of the electrode pad EP in the Y direction is, for example, approximately, 47 μm. The interval $D_{EP}$ between the adjacent electrode pads EP is, for example, approximately 3 μm.

The electrode pad EP is electrically coupled to the memory circuit formed at the main surface of the semiconductor wafer SW via the wiring. In the post-processing, the probe needle is brought into contact with the upper surface of the electrode pad EP, thereby writing data in the memory circuit.

Figure 5B:
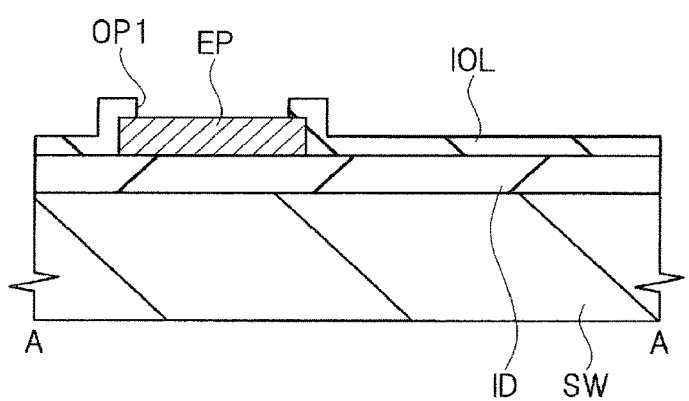

Then, as shown in FIGS. 4B, 5A, and 5B, the first insulating member IOL is formed over the main surface of the semiconductor wafer SW to cover the electrode pads EP. The first insulating member IOL is an inorganic insulating film, and made of, for example, a silicon oxynitride (SiON) film, silicon oxide ($SiO_2$) film, a silicon nitride ($Si_3N_4$) film, etc. These films are formed, for example, by a plasma CVD (chemical vapor deposition) method. The thickness of the first insulating member IOL is, for example, in a range of approximately 0.6 μm to 0.8 μm. For example, an Young's modulus of the silicon nitride ($Si_3N_4$) film is in a range of approximately 250 GPa to 300 GPa.

Then, the first insulating member IOL is etched using a resist pattern (not shown) formed by a lithography technique as a mask to thereby form the openings OP1 that expose the upper surfaces of the electrode pads EP therefrom. The width $W_{OP1}$ of the opening OP1 in the X direction is, for example, approximately 100 μm. The width $L_{OP1}$ of the opening OP1 in the Y direction is, for example, approximately 45 μm. The interval $D_{OP1}$ between the adjacent openings OP1 is, for example, approximately 5 μm.

In this way, even when the openings OP1 are formed in the first insulating member IOL, the distance between the peripheral edge of the electrode pad EP and the opening end of the opening OP1 is set to 1 μm or more, which can prevent the peripheral edge of the electrode pad EP from being exposed from the opening OP1 even if the resist pattern is misaligned, or the first insulating member IOL is overetched.

2. Second Insulating Member Formation (Step S2)

Figure 6A:
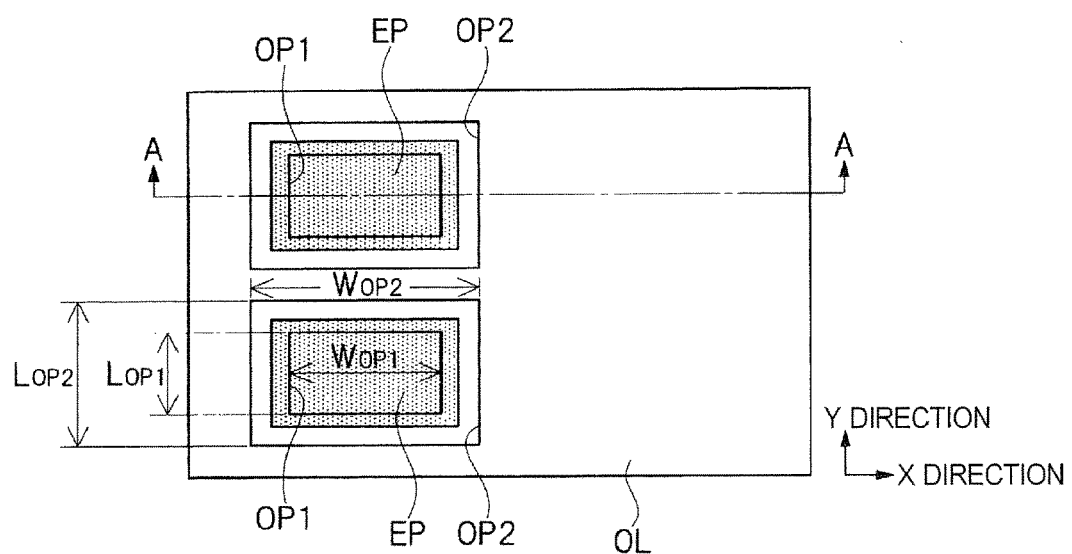
FIGS. 6A and 6B are an enlarged plan view and an enlarged cross-sectional view, respectively, showing a main part of the semiconductor device obtained in another manufacturing process for the semiconductor device, following the process of FIGS. 5A and 5B.
Figure 6B:
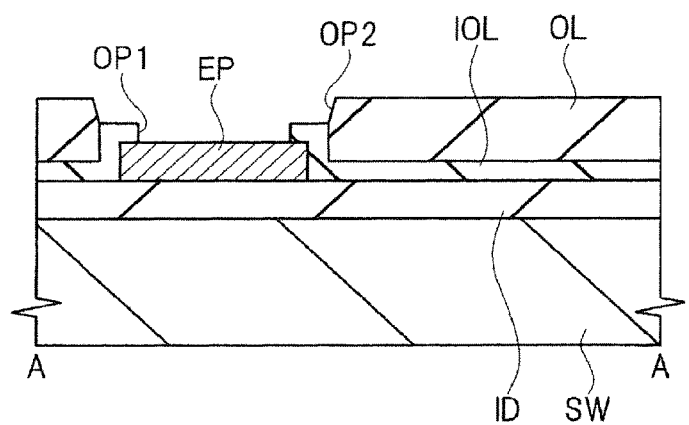

Then, as shown in FIGS. 6A and 6B, the second insulating member OL is formed over the main surface of the semiconductor wafer SW. The second insulating member OL is an organic insulating film, for example, a polyimide film, etc. This film is formed, for example, by a spin-coating method. The thickness of the second insulating member OL is, for example, approximately 5 μm. The elastic modulus of the second insulating member OL is lower than that of the first insulating member IOL. For example, an Young's modulus of the polyimide film is in a range of approximately 3 GPa to 7 GPa.

In the post-process, the relocation wiring RW is formed to be electrically coupled to the electrode pad EP. If the relocation wiring RW is formed over the first insulating member OL, damage (for example, disconnection or cracks) might occur in the relocation wiring RW or a layer positioned under (as a lower layer to) the relocation wiring RW (wiring layer, insulating layer including the first insulating member IOL, etc.) due to stress in mounting (assembly) or in the actual usage environment. Additionally, when the formed first insulating member IOL is thin, it is difficult to maintain the capacity between the wiring positioned under the first insulating member IOL (as a lower layer) and the relocation wiring RW formed over the first insulating member OL, which might not possibly achieve the desired electric characteristics due to the influence of noise. To avoid these states, the second insulating member OL is formed over the first insulating member IOL.

Then, the second insulating member OL is etched using a resist pattern formed by a lithography technique as a mask (not shown) to thereby form the openings OP2 that expose the upper surfaces of the electrode pads EP therefrom.

Since the second insulating member OL is semi-transparent, it is difficult to specify the position where the probe needle is to contact, when the probe needle is brought into contact with the electrode pad EP in the post-process, if the opening end of the opening OP2 formed in the second insulating member OL is placed inside the opening end of the opening OP1 formed in the first insulating member IOL. The opening OP2 is formed in the second insulating member OL to surely expose the opening OP1 formed in the first insulating member IOL from the opening OP2. That is, the opening OP2 is formed in the second insulting member OL in the following way. Specifically, the width $W_{OP2}$ of the opening OP2 formed in the second insulating member OL in the X direction is equal to or larger than the width $W_{OP1}$ of the opening OP1 formed in the first insulating member IOL. The width $L_{OP2}$ of the opening OP2 formed in the second insulating member OL in the Y direction is equal to or larger than the width $L_{OP1}$ of the opening OP1 formed in the first insulating member IOL.

Thereafter, the semiconductor wafer SW is subjected to a heat treatment at a temperature, for example, of approximately 300° C. to 400° C., thereby hardening the second insulating member OL.

3. Data Writing (Probing) (Step S3)

Figure 7A:
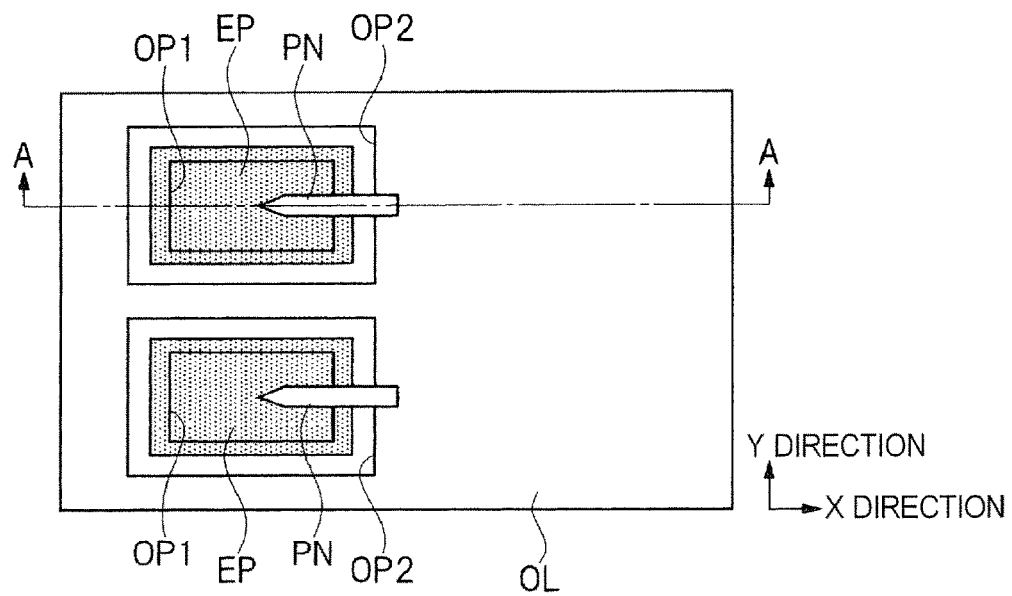
FIGS. 7A and 7B are an enlarged plan view and an enlarged cross-sectional view, respectively, showing a main part of the semiconductor device obtained in another manufacturing process for the semiconductor device, following the process of FIGS. 6A and 6B.
Figure 7B:
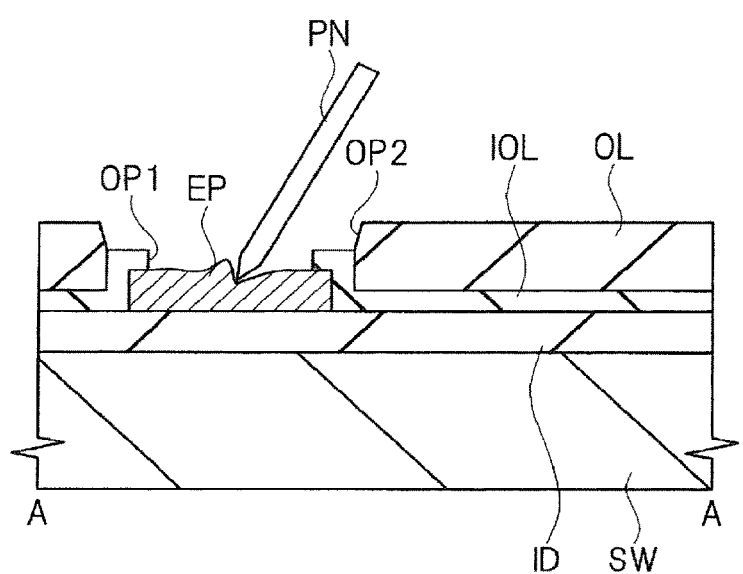

Then, as shown in FIGS. 7A and 7B, a probe needle PN is brought into contact with the electrode pad EP, thereby writing data in the memory circuit formed at the main surface of the semiconductor wafer SW. In addition to the writing process of data, a screening test for examining the initial failure of the memory circuit is performed. Based on the result of screening, for example, a defective memory cell can be replaced, and the information can be rewritten.

After the heat treatment for hardening the second insulating member OL in this way, data can be written in the memory circuit, thereby avoiding the loss of data written in the memory circuit.

The probe needle PN is made of hard metal, such as tungsten (W). The tip of the probe needle PN is so sharp that a probe mark can occur at the upper surface of the electrode pad EP that includes an aluminum (Al) film as the main conductive layer.

4. Cover Film Formation (Step S4)

Figure 8A:
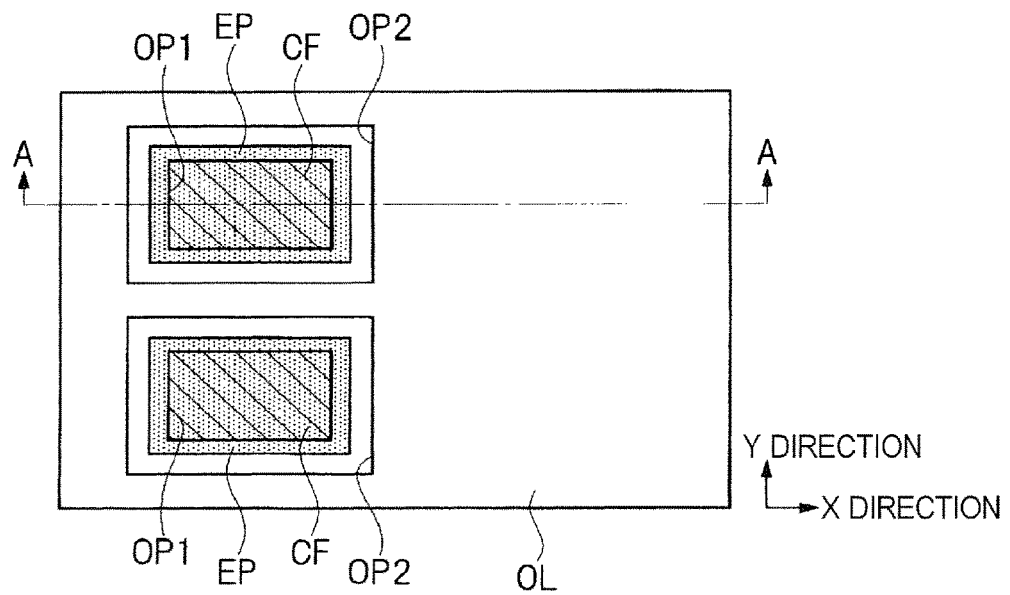
FIGS. 8A and 8B are an enlarged plan view and an enlarged cross-sectional view, respectively, showing a main part of the semiconductor device obtained in another manufacturing process for the semiconductor device, following the process of FIGS. 7A and 7B.
Figure 8B:
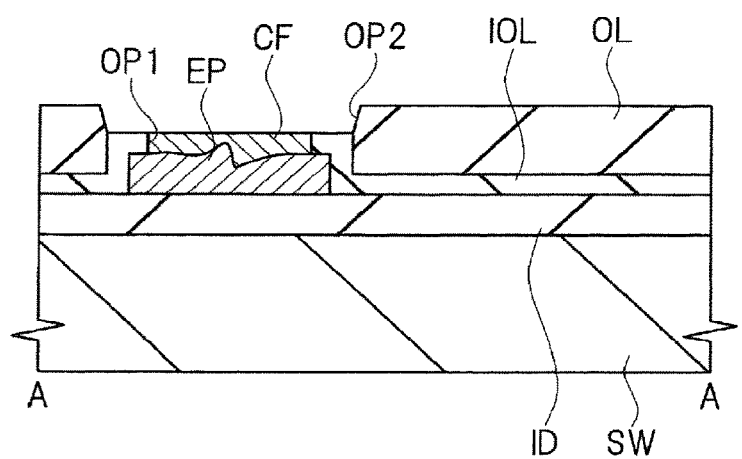

Then, as shown in FIGS. 8A and 8B, the cover film CF is formed to fill the inside of the opening end of the opening OP1 formed in the first insulating member IOL. Thus, the upper surface of the electrode pad EP exposed from the opening OP1 formed in the first insulating member IOL is covered with the cover film CF.

The cover film CF is made, for example, of nickel (Ni), etc., and formed, for example, by using plating, especially, electroless plating. The cover film CF is not limited to the nickel (Ni) film. Alternatively, for example, the cover film CF may be a laminated film (Ni/Pd/Au) comprised of a nickel (Ni) film, a palladium (Pd) film, and a gold (Au) film formed from the bottom in this order, a laminated film (Ni/Au) comprised of a nickel (Ni) film and a gold (Au) film formed from the bottom in this order, or a laminated film (Ni/Pd) comprised of a nickel (Ni) film and a palladium (Pd) film formed from the bottom in this order. Like this embodiment, when the electrode pad EP contains material of an aluminum (Al) film as a principal element, a zincate treatment (a substitution reaction between zinc (Zn) and aluminum (Al)) may be performed using metal having a smaller ionization tendency (e.g., zinc (Zn)), and then the nickel (Ni) film may be formed.

The thickness of the cover film CF is substantially the same as that of the first insulating member IOL (for example, of 0.6 μm to 0.8 μm in thickness). Since the upper surface of the electrode pad EP has only to be covered, the cover film CF may be thinner (to have a thickness, e.g., of 0.1 μm) or thicker than the first insulating member IOL. If the cover film CF is excessively thick, the cover film CF might be formed over the upper surface of the second insulating member OL, whereby the cover films CF formed over the respective upper surfaces of the adjacent electrode pads EP might be coupled together to cause short-circuit between the adjacent electrode pads EP. The thickness of the thick cover film CF is preferably the substantially same as that of the first insulating member IOL in terms of time and material cost required for the plating.

5. Relocation Wiring Formation (Step S5)

Figure 9A:
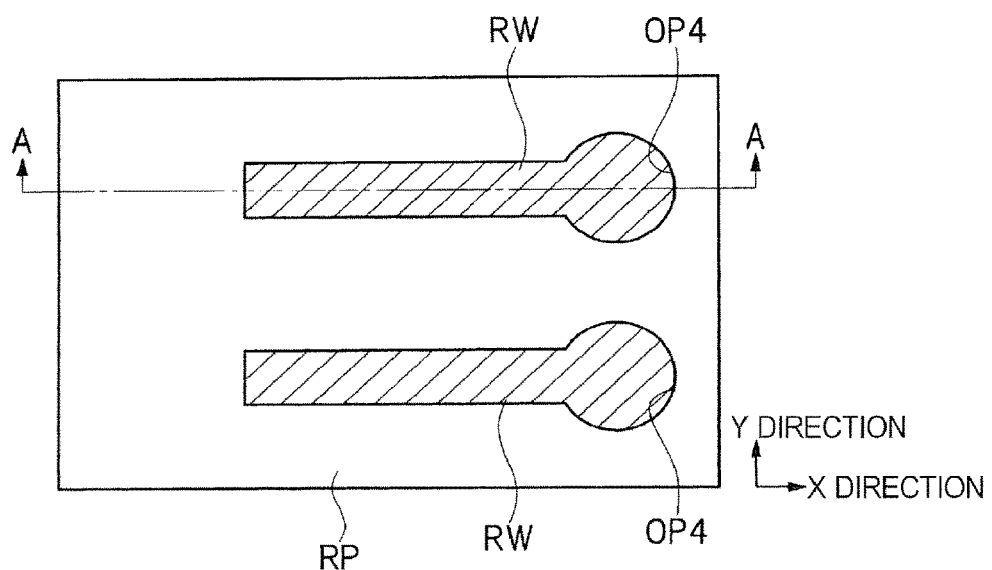
FIGS. 9A and 9B are an enlarged plan view and an enlarged cross-sectional view, respectively, showing a main part of the semiconductor device obtained in another manufacturing process for the semiconductor device, following the process of FIGS. 8A and 8B.
Figure 9B:
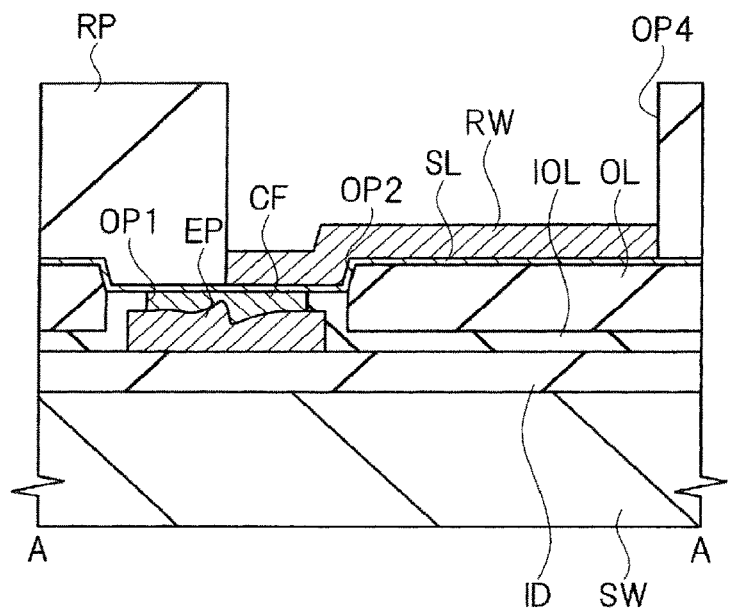

Then, as shown in FIGS. 9A and 9B, the seed layer SL is formed over the second insulating member OL to be electrically coupled to the cover film CF. The seed layer SL is a layer serving as the seed for the relocation wiring RW to be formed in the post-process. The seed layer SL is formed, for example, by sputtering. The seed layer SL is comprised of a laminated film, for example, obtained by stacking a titanium (Ti) film and a copper (Cu) film in this order. The thickness (total thickness) of the seed layer SL is, for example, approximately 0.3 μm. Specifically, the thickness of the titanium (Ti) film is about 0.2 μm, and the thickness of the copper (Cu) film is about 0.1 μm. Alternatively, the seed layer SL may be formed by electroless plating.

Subsequently, a resist pattern RP is formed over the main surface of the semiconductor wafer SW by the lithography technique. The resist pattern RP is formed to expose apart of the seed layer SL and provided with openings OP4 for the relocation wiring formation. FIG. 9A shows the state obtained after formation of the resist pattern RP.

Subsequently, the relocation wirings RW are formed over the seed layer SL exposed from the openings OP4 formed in the resist pattern RP by electrolytic plating. At this time, the seed layer SL extending to the outside of the device region DR is used as a wiring for power feeding. Specifically, the relocation wiring RW is formed over the second insulating member OL to be electrically coupled to the cover film CF and to lie toward the center side of the device region (device region DR shown in FIGS. 4A and 4B). The relocation wiring RW is made, for example, of copper (Cu), and has a thickness, e.g., of approximately 5 μm.

Figure 10A:
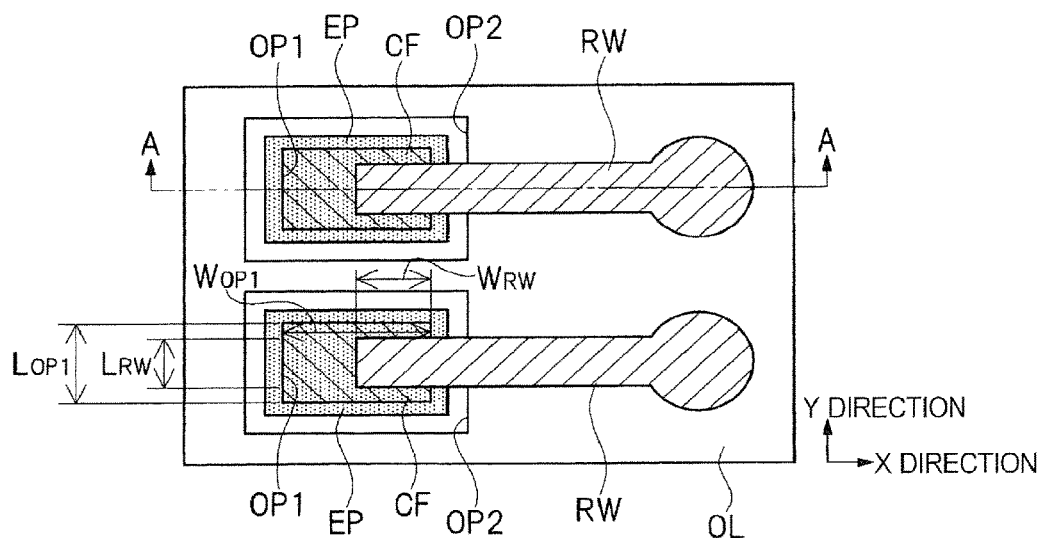
FIGS. 10A and 10B are an enlarged plan view and an enlarged cross-sectional view, respectively, showing a main part of the semiconductor device obtained in another manufacturing process for the semiconductor device, following the process of FIGS. 9A and 9B.
Figure 10B:
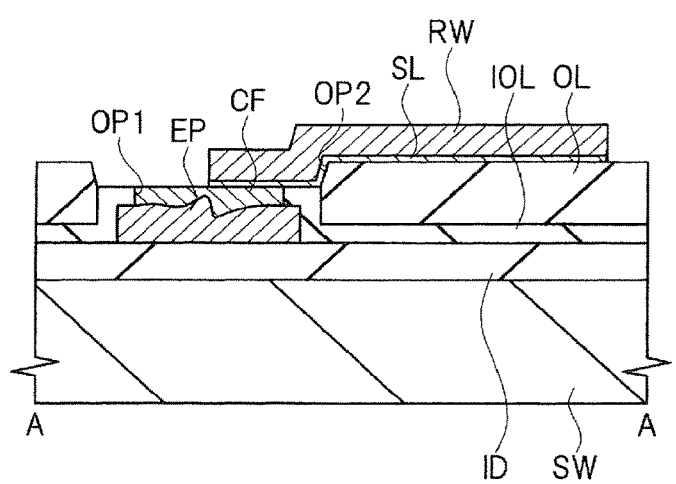

Next, as shown in FIGS. 10A and 10B, after removing the resist pattern RP, the exposed seed layer SL is removed by wet etching using the relocation wiring RW as a mask. Thus, the seed layer SL under the relocation wiring RW is maintained, and the remaining part of the seed layer SL under the resist pattern RP except for the seed layer SL under the wiring RW is removed.

The relocation wiring RW is formed from over the second insulating member OL on the center side of the device region to the inside of the opening end of the opening OP1 formed in the first insulating member IOL. That is, the relocation wiring RW has one end positioned inside the opening end of the opening OP1 formed in the first insulating member IOL, while having the other end positioned over the second insulating member OL on the center side of the device region.

In the X direction, the relocation wiring RW is formed such that the end surface of one end of the relocation wiring RW is positioned inside the opening end of the opening OP1 formed in the first insulting member IOL, or over one opening end on the outer peripheral side of the device region, among the two opening ends opposed to each other in the X direction of the opening portion OP1 formed in the first insulating member IOL. In other words, the width $W_{RW}$ in the X direction of the part of the relocation wiring RW arranged inside the opening end of the opening OP1 formed in the first insulating member IOL is equal to or smaller than the width (length) in the X direction of the cover film CF, or the width $W_{OP1}$ in the X direction of the opening OP1 formed in the first insulating member IOL.

In the Y direction, the relocation wiring RW is formed inside two opening ends opposed to each other in the Y direction of the opening OP1 formed in the first insulating member IOL. In other words, the width $L_{RW}$ in the Y direction of the part of the relocation wiring RW directly above the electrode pad EP is equal to or smaller than the width (length) in the Y direction of the cover film CF, or the width $L_{OP1}$ in the Y direction of the opening OP1 formed in the first insulating member IOL.

In this way, the upper limit of the width $L_{RW}$ of the relocation wiring RW in the Y direction is set to the same as the width (length) in the Y direction of the cover film CF, or the width $L_{OP1}$ in the Y direction of the opening OP1, whereby the interval between the relocation wirings RW electrically coupled to the adjacent electrode pads EP is, for example, 5 μm or more. The upper limit of the width $L_{RW}$ of the relocation wiring RW in the Y direction is set smaller than the width (length) in the Y direction of the cover film CF or the width $L_{OP1}$ in the Y direction of the opening OP1, whereby the interval (distance) between the relocation wirings RW electrically coupled to the adjacent electrode pads EP can be set larger than the interval (distance) between the adjacent cover films CF. This arrangement can prevent the contact between the adjacent relocation wirings RW.

When the width $W_{RW}$ in the X direction of the relocation wiring RX is smaller than the width $W_{OP1}$ in the X direction of the opening OP1 formed in the first insulating member IOL, or when the width $L_{RW}$ in the Y direction of the relocation wiring RW is smaller than the width $L_{OP1}$ in the Y direction of the opening OP1 formed in the first insulting member IOL, a partial region directly above the electrode pad ED is not covered by the relocation wiring RW. However, the upper surface of the electrode pad EP positioned inside the opening end of the opening OP1 formed in the first insulating member IOL is covered with the cover film CF, whereby the upper surface of the electrode pad EP is not exposed. Therefore, in the post-process, even when the third insulating member SR is formed to cover the relocation wiring RW, the electrode pad EP is not in direct contact with the third insulting member SR, which prevents the deterioration of the electrode pad EP (corrosion etc.) described above.

In removing the unnecessary seed layer SL, for example, the wet etching method (or the dry etching method after applying the wet etching method) is used. However, if the electrode pad EP is directly exposed to the etchant, the electrode pad EP will become deteriorated (will be subject to corrosion, or will have its shape changed, or the like). However, since the cover film CF covers the upper surface of the electrode pad EP positioned inside the opening end of the opening OP1 formed in the first insulating member IOL, the upper surface of the electrode pad EP is not exposed. Therefore, even if the unnecessary seed layer SL is removed by using the wet etching, the electrode pad EP is preventing from becoming deteriorated (being subject to corrosion or changing its shape, etc.), which does not cause the failure of the electrical characteristics.

The relocation wiring RW having the same plan shape as that of the opening OP1 may be formed from one to the other of the two opposed opening ends in the X direction of the opening OP1 formed in the first insulating member IOL, and from one to the other of the two opposed opening ends in the Y direction of the opening OP1 formed in the first insulating member IOL, that is, directly above the electrode pad EP. In this case, the contact area between the relocation wiring RW and the cover film CF is increased, whereby the contact resistance can be more decreased.

In this case, if the electrode pad EP is misaligned with the relocation wiring RW, a partial region directly above the electrode pad EP is not covered by the relocation wiring RW. However, the upper surface of the electrode pad EP positioned inside the opening end of the opening OP1 formed in the first insulating member IOL is covered by the cover film CF, whereby the upper surface of the electrode pad EP is not exposed. Therefore, as mentioned above, this arrangement can avoid the problems, including corrosion of the electrode pad EP, and peeling of the third insulating member SR formed in the post-process, from the electrode EP.

Figure 11A:
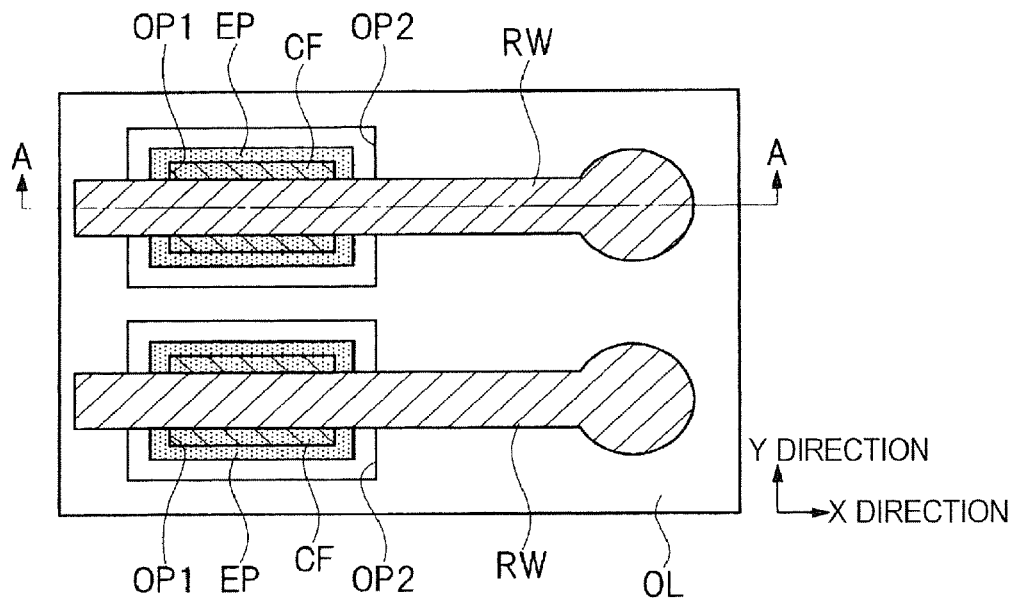
FIGS. 11A and 11B are an enlarged plan view and an enlarged cross-sectional view, respectively, showing a main part of the semiconductor device obtained in another manufacturing process for the semiconductor device (in another example with a structure different from that shown in FIGS. 10A and 10B), following the process of FIGS. 9A and 9B.
Figure 11B:
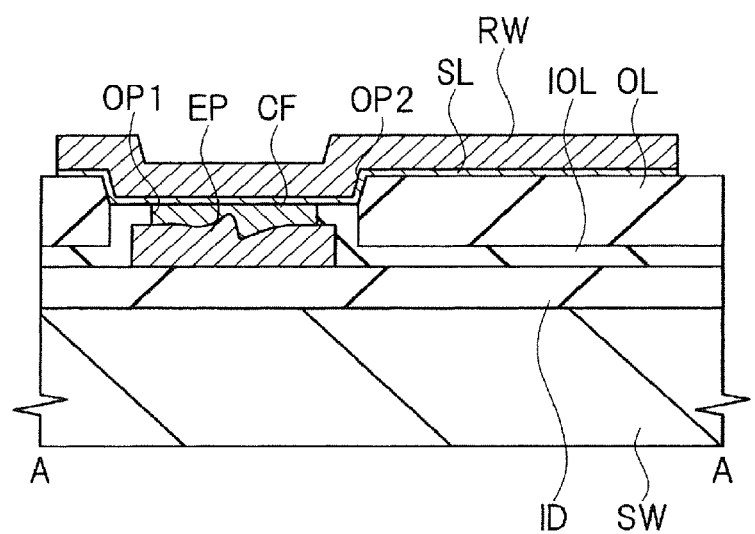

FIGS. 11A and 11B illustrate another structure of the relocation wirings RW. One end of the relocation wiring RW formed on the outer peripheral side of the device region is positioned over the second insulating member OL on the outer peripheral side of the device region, and may be closer to the outer peripheral edge of the device region. Although as mentioned in the description of this embodiment with reference to FIG. 1, the electrode pads EP are provided at the outer periphery of the device region, the electrode pads EP may be arranged at the center of the device region. In this case, some or all of the relocation wirings RW are derived toward the outer peripheral side of the device region DR (see FIGS. 4A and 4B).

6. Third Insulating Member Formation (Step S6)

Figure 12A:
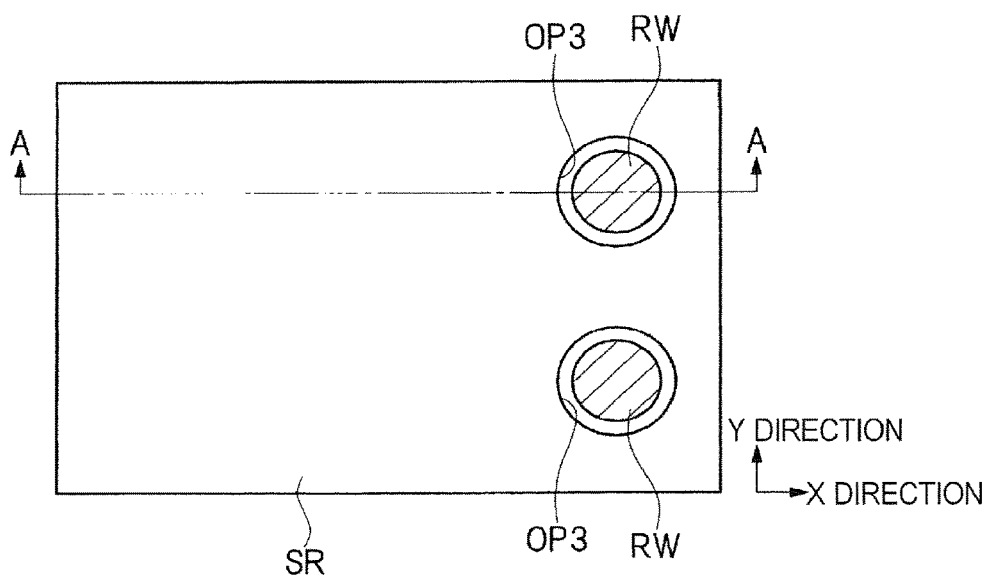
FIGS. 12A and 12B are an enlarged plan view and an enlarged cross-sectional view, respectively, showing a main part of the semiconductor device obtained in another manufacturing process for the semiconductor device, following the process of FIGS. 10A and 10B.
Figure 12B:
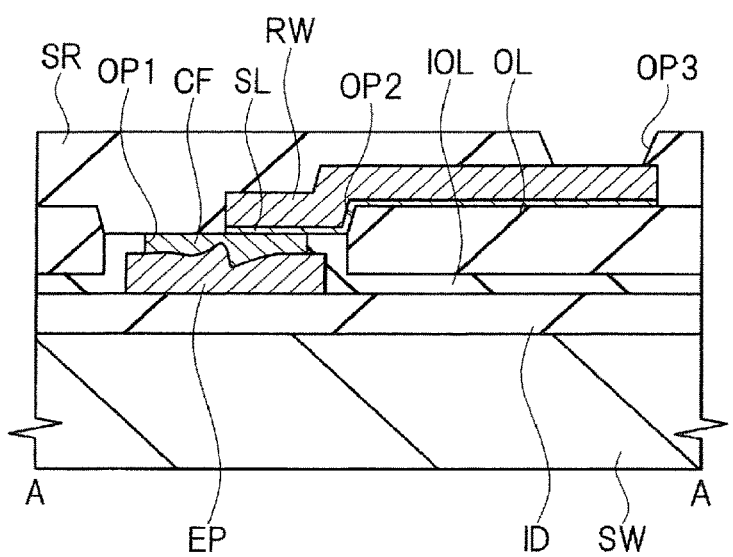

Then, as shown in FIGS. 12A and 12B, the third insulating member SR is formed over the main surface of the semiconductor wafer SW. The third insulating member SR in this embodiment is an organic insulating film. Specifically, the third insulating member SR is, for example, a polyimide film. In this embodiment, the third insulating member SR serves as the protective film at the uppermost surface. As also described in a modified example later, an epoxy resin containing a filler (e.g., silica) may be used as the third insulating member SR, instead of the polyimide film.

As mentioned above, the cover film CF covers the upper surface of the electrode pad EP positioned inside the opening end of the opening OP1 formed in the first insulating member IOL. The upper surface of the electrode pad EP is not exposed, even when the width $W_{RW}$ of the relocation wiring RW in the X direction is smaller than the width (length) of the cover film CF or the width $W_{OP1}$ of the opening OP1 formed in the first insulating member IOL, or even when the width $L_{RW}$ of the relocation wiring RW in the Y direction is smaller than the width (length) of the cover film CF or the width $L_{OP1}$ of the opening OP1 formed in the first insulating member IOL. Thus, the third insulating member SR covering the relocation wirings RW is not in direct contact with the electrode pads EP.

Then, a resist pattern is formed over the third insulating member SR by the lithography technique. By using the resist pattern as a mask (not shown), a part of the third insulating member SR is removed, for example, by etching. Thus, the opening OP3 is formed on a side opposite to one end (one part) of the relocation wiring RW electrically coupled to the electrode pad EP to expose the other end (the other part) of the relocation wiring RW positioned over the second insulating member OL.

7. Bump Electrode Formation (Step S7)

Figure 13A:
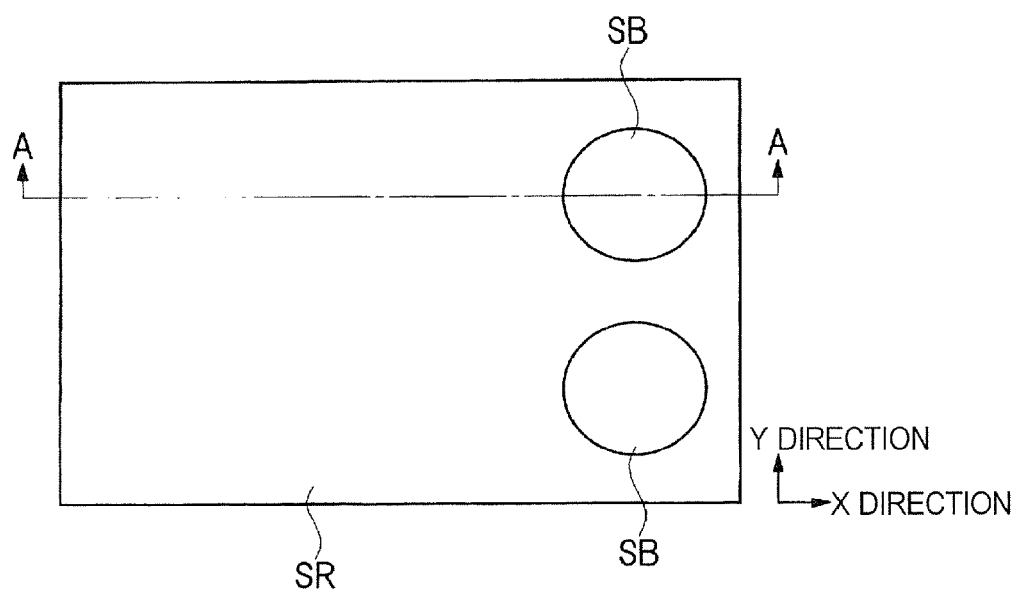
FIGS. 13A and 13B are an enlarged plan view and an enlarged cross-sectional view, respectively, showing a main part of the semiconductor device obtained in another manufacturing process for the semiconductor device, following the process of FIGS. 12A and 12B.
Figure 13B:
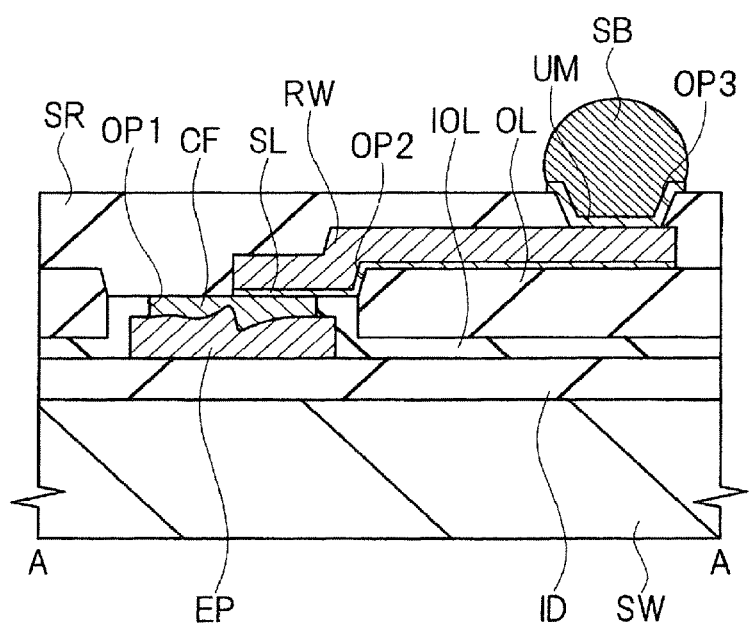
Figure 14:
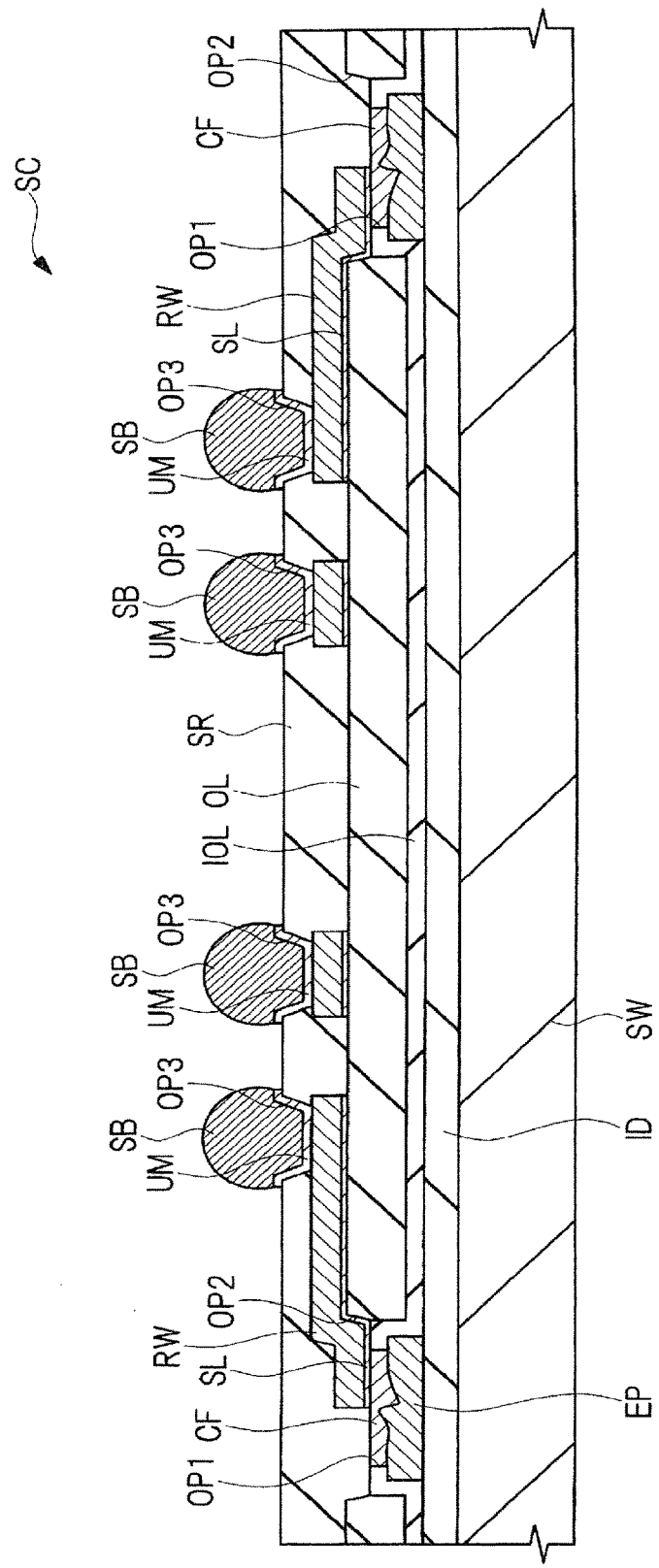
FIG. 14 is a cross-sectional view showing a main part of the semiconductor device obtained in another manufacturing process of the manufacturing method of the semiconductor device, following the process of FIGS. 12A and 12B.

Next, as shown in FIGS. 13A and 13B, an electrode layer (electrode) UM required to form the bump electrode is formed in each opening OP3. The electrode layer UM is made, for example, of copper (Cu) or nickel (Ni) by the electroless plating. Subsequently, a flux or solder paste is supplied to the upper surface of the electrode layer UM, and further solder balls are arranged thereon. Then, a reflow process is performed. The solder ball for use contains, for example, a solder having a lead-free solder composition that does not substantially contain lead (Pb). The reflow process is performed to remove an oxide film covering the surface of the solder ball by flux, thereby melting the solder balls, or melting the solder balls and the solder paste, to integrate them together. As a result, each of the bump electrodes SB is formed to be electrically and mechanically coupled to the corresponding electrode layer UM.

Thereafter, the scribe region (scribe region LR shown in FIGS. 4A and 4B) between the device regions, into which the semiconductor wafer SW is partitioned, is cut (singulated) to substantially complete the production of the semiconductor devices (semiconductor chips) SC of this embodiment.

In this way, this embodiment can obtain the following effects.

(1) The relocation wirings RW are formed over the first insulating member IOL via the second insulating member OL, which can suppress the occurrence of damage (for example, disconnection, cracks, and the like) to the relocation wiring (wiring, rewiring) RW or the layer under the relocation wiring RW (wiring layer or insulating layer including the first insulating member IOL).

(2) Further, after hardening the second insulating member OL by a heat treatment at a temperature, for example, of about 300° C. to 400° C., data is written in the memory circuit, which can avoid the loss of the data.

(3) The cover film CF is formed over the upper surface of the electrode pad EP positioned inside the opening end of the opening OP1 formed in the first insulating member IOL. Even when the width $L_{RW}$ of the relocation wiring RW in the Y direction is set smaller than the width $L_{OP1}$ of the opening OP1 formed in the first insulating member IOL so as to reduce the pitch, the surface of the electrode pad EP is not exposed. Thus, this embodiment can avoid the problem of deterioration (corrosion, change in shape, etc.) of the surface of the electrode pad EP when forming the relocation wiring RW, specifically, in the step of the process for removing the seed layer SL (of the wet etching method or dry etching method, or the like).

(4) In the Y direction, the width $L_{RW}$ of the relocation wiring RW can be set the same or smaller than the width $L_{OP1}$ of the opening OP1 formed in the first insulating member IOL, thereby avoiding the contact between the relocation wirings RW next to each other in the Y direction.

In use of copper (Cu) as the material for the relocation wiring RW, as the interval (distance) between the adjacent wirings is decreased, the problem of migration is more likely to occur. Thus, this embodiment is particularly effective when using the copper (Cu) as the material for the relocation wiring RW.

Accordingly, this embodiment can exhibit these effects to improve the reliability of the semiconductor device. Further, this embodiment can achieve the reduction in size of the semiconductor device, specifically, the reduction in pitch between the electrode pads.

MODIFIED EXAMPLE

Although the invention made by the inventors has been specifically described based on the embodiments, it is apparent that the invention is not limited to the above embodiments, and that various modifications and changes can be made without departing from the scope of the invention.

First Modified Example

Figure 15:
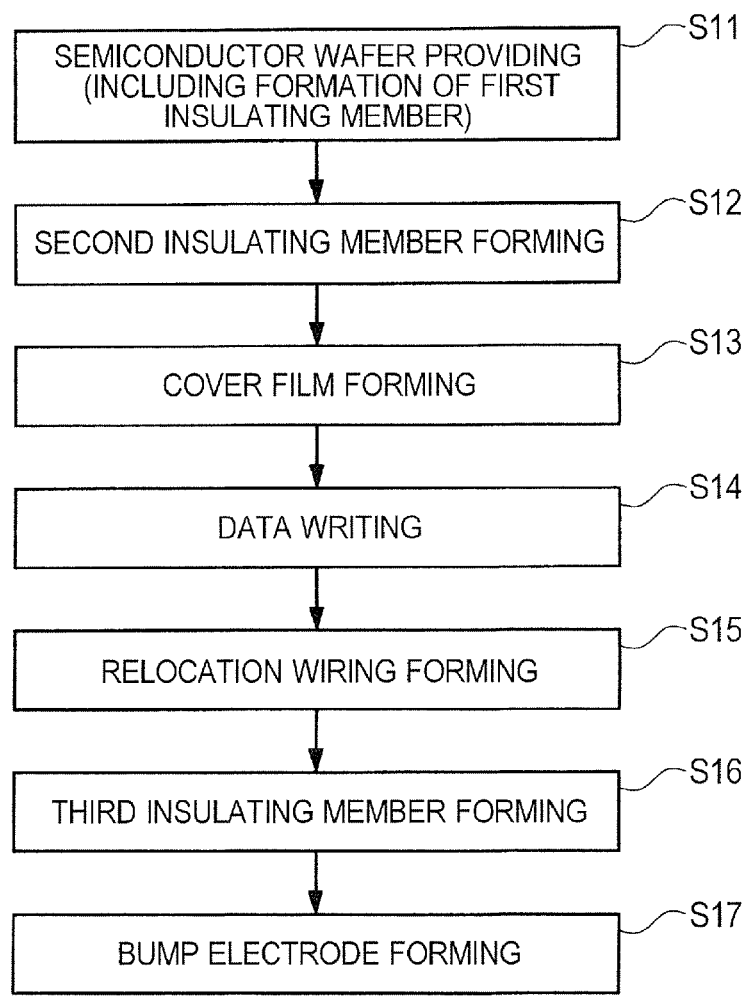
FIG. 15 is a flowchart showing one example of the flow of manufacturing processes in a manufacturing method of the semiconductor device according to a first modified example.
Figure 16A:
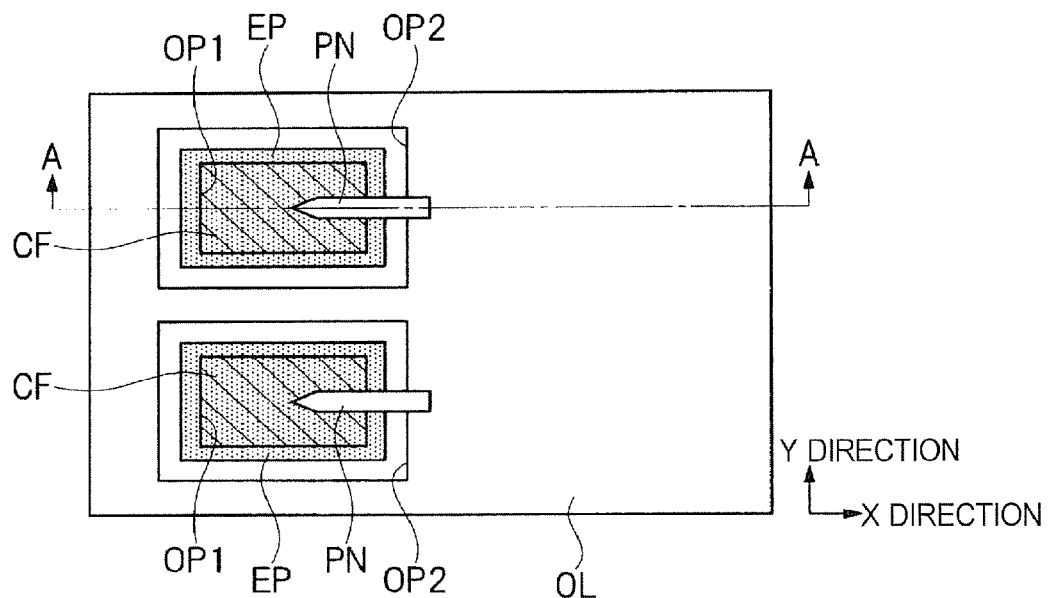
FIGS. 16A and 16B are an enlarged plan view and an enlarged cross-sectional view, respectively, showing a main part of the semiconductor device obtained in one manufacturing process for the semiconductor device in the first modified example.
Figure 16B:
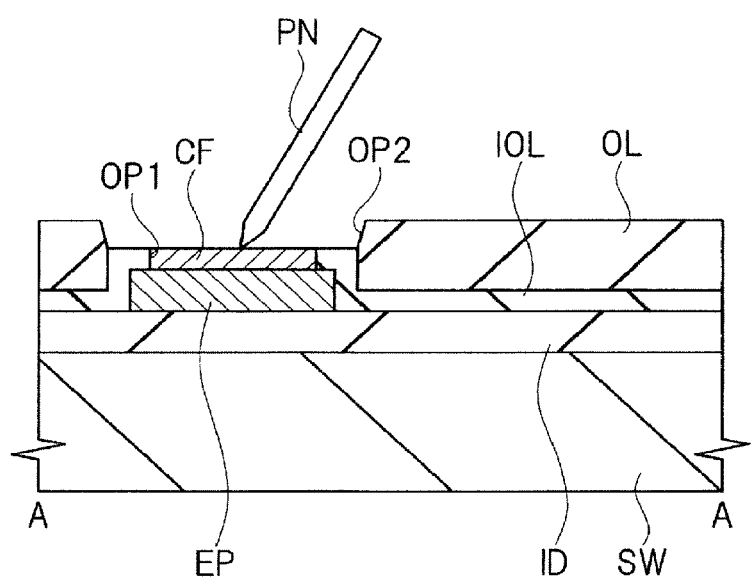

A method of manufacturing the semiconductor device in a first modified example will be described below with reference to FIGS. 15 and 16A and 16B. Only different points from the contents described in the above-mentioned embodiments will be described below. FIG. 15 is a flowchart showing one example of the flow of manufacturing processes in a manufacturing method of the semiconductor device according to the first modified example. FIGS. 16A and 16B are an enlarged plan view and an enlarged cross-sectional view, respectively, showing a main part of the semiconductor device obtained in one manufacturing process for the semiconductor device in the first modified example.

In the manufacturing processes for the semiconductor device in the embodiment shown in FIG. 3, after forming the second insulating member OL, the probe needle PN is brought into contact with the electrode pad EP, thereby writing the data in the memory circuit.

On the other hand, in the first modified example, as shown in FIG. 15, after forming the cover film CF, the probe needle PN is brought into contact with the cover film CF, thereby writing the data in the memory circuit.

As shown in FIGS. 16A and 16B, the cover film CF is formed to fill the inside of the opening end of the opening OP1 formed in the first insulating member IOL. In this way, the cover film CF covers the upper surface of the electrode pad EP exposed from each opening OP1 formed in the first insulating member IOL.

The thickness of the electrode pad EP is, for example, in a range of approximately 0.4 μm to 6.0 μm. The typical thickness of the electrode pad EP can be approximately 1.0 μm by way of example. If the thickness of the electrode pad EP is thin, for example, about 0.4 μm, in the screening test for examining the initial failure of the memory circuit or the like, a large amount of current cannot flow through the electrode pad, and as a result, the checking items are limited. On the other hand, if the thickness of the electrode pad EP is thick, for example, about 6.0 μm, since the electrode pad EP includes, for example, the aluminum (Al) film as the main conductive layer, the deformation of the electrode pad EP made by the probe needle PN will become larger, causing a node or peeling, and the like.

However, in the first modified example, the probe needle PN is brought into contact with the cover film CF, so that the large amount of current can flow through the device. Since the nickel (Ni) film is harder than the aluminum (Al) film (a Mohs hardness of aluminum (Al) is in a range of 2 to 2.9, a Mohs hardness of nickel (Ni) is 5, and a Mohs hardness of tungsten carbide (WS) is 9), the deformation of the cover film CF due to the contact with the probe needle PN can be controlled to be smaller than that of the electrode pad EP.

Second Modified Example

Figure 17:
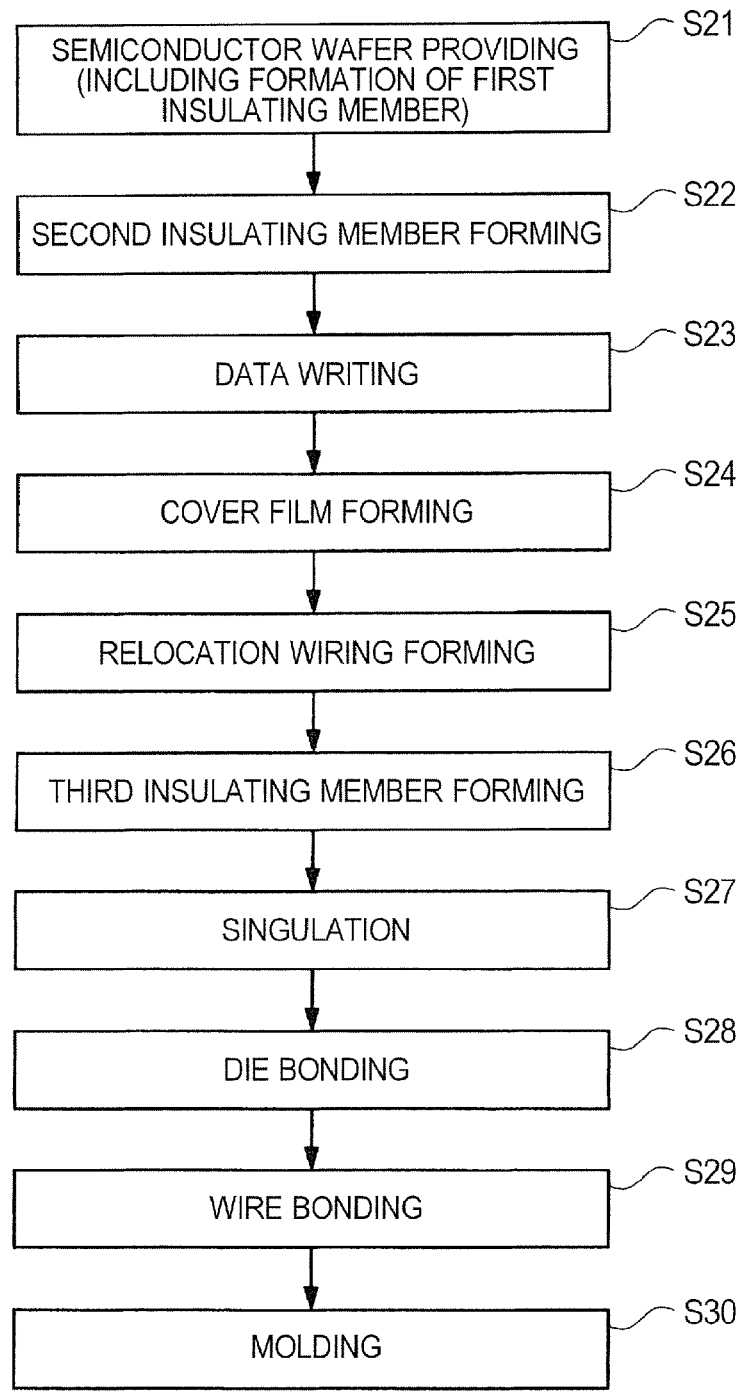
FIG. 17 is a flowchart showing one example of the flow of manufacturing processes in a manufacturing method of a semiconductor device according to a second modified example.
Figure 18:
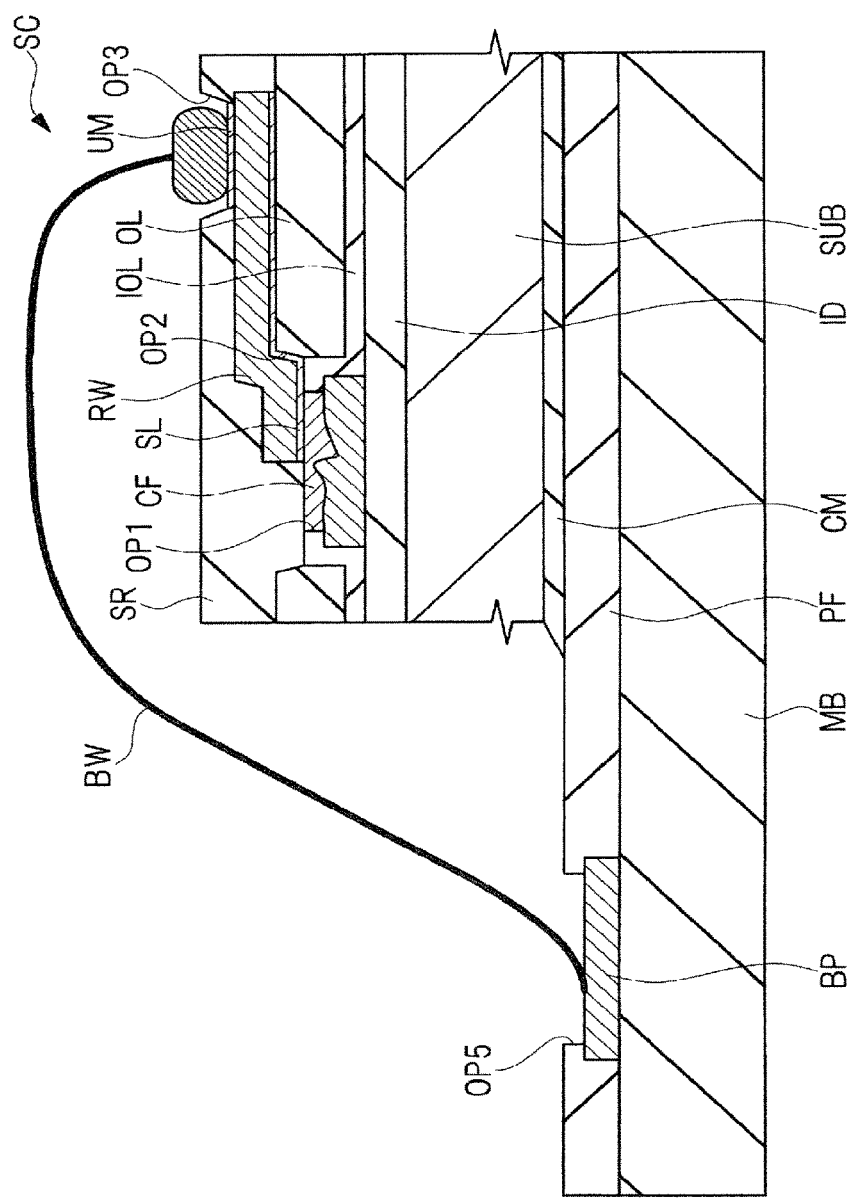
FIG. 18 is a cross-sectional view showing a main part of the semiconductor device in the second modified example.

A semiconductor device according to a second modified embodiment will be described below with reference to FIGS. 17 and 18. Note that like the first modified example, only different points from the contents described in the above-mentioned embodiment will be described. FIG. 17 is a flowchart showing one example of the flow of manufacturing processes in a manufacturing method of the semiconductor device in the second modified example. FIG. 18 is a cross-sectional view showing a main part of the semiconductor device in the second modified example.

In the manufacturing method of the semiconductor device in the second modified example, after carrying out the same processes as those from the semiconductor wafer provision step (step S1 in FIG. 3) to the third insulting member formation step (step S6 in FIG. 3) as described in the above-mentioned embodiment, the electrode layer (electrode) UM is formed at the surface of the relocation wiring RW exposed from the opening OP3 of the third insulating member SR, and further the following processes are to be performed. The electrode layer UM formed at the surface of the relocation wiring RW and exposed from the opening OP3 of the third insulating member SR is made, e.g., of gold (Au), palladium (Pd), etc., for example, by electrolytic plating.

7. Singulation (Wafer Dicing) (Step S27)

The semiconductor wafer is cut along the scribe region between the device regions, into which the semiconductor wafer SW is partitioned, to be divided into individual semiconductor chips.

8. Die Bonding (Step S28)

Then, as shown in FIG. 18, for example, a wiring board (substrate) MB is provided which has a plurality of electrode pads (electrodes, bonding leads) BP formed on its main surface. The electrode pads BP are comprised of parts of the wirings formed over the surface of the wiring board MB. The upper surfaces of these electrode pads BP are exposed from a plurality of openings OP5 that are formed corresponding to the respective electrode pads BP in a protective film PF formed over the surface of the wiring board MB.

Then, an adhesive CM is applied to chip mounting regions over the surface of the wiring board MB. Suitable material for use in the adhesive CM is, for example, a thermosetting epoxy resin. Subsequently, the semiconductor chip is mounted in the chip mounting region via the adhesive CM, and then subjected to the heat treatment to harden the adhesive CM, whereby the semiconductor chip is bonded and fixed in the chip mounting region.

9. Wire Bonding (Step S29)

Conductive wires (conductive members, bonding wires) BW, for example, gold (Au) wires are used to electrically couple the other ends of the relocation wirings RW exposed from the respective openings OP3 formed in the third insulating member SR, to the respective electrode pads BP formed over the surface of the wiring board MB and exposed from the respective openings OP5 formed in the protective film PF. In detail, a part of the conductive wire BW is electrically coupled to the other end of the relocation wiring RW via the above-mentioned electrode layer UM, and the remaining other part of the conductive wire BW is electrically coupled to the electrode pad BP of the wiring board MB.

For this coupling, a forward bonding is used in most cases, but a reverse bonding may be used. The forward bonding is a bonding way in which the relocation wiring RW formed in the semiconductor chip is coupled to one end of the conductive wire BW, and then the electrode pad BP arranged at the surface of the wiring board MB is coupled to the other end of the conductive wire BW. On the other hand, the reverse bonding is a bonding way in which the electrode pad BP arranged at the surface of the wiring board MB is coupled to the other end of the conductive wire BW, and then the relocation wiring RW formed in the semiconductor chip is coupled to the one end of the conductive wire BW.

In the second modified example, like the above-mentioned embodiment, the relocation wirings RW are formed over the second insulating member OL, which can prevent a load (vertical load) generated upon coupling the relocation wiring RW to a part of the conductive wire BW from being applied to the member positioned on the lower layer side of the relocation wiring RW.

10. Molding (Step S30)

Then, the semiconductor chips mounted on the wiring board MB are sealed with resin (not shown) to forma resin seal body. Resins suitable for use can include, for example, a thermosetting epoxy resin containing fillers (e.g., silica). Thereafter, although not shown, solder balls serving as the external electrodes are mounted on the backside (mounting surface) of the wiring board MB. The semiconductor device SC as used in the second modified example means one obtained through these processes.

Third Modified Example

Figure 19:
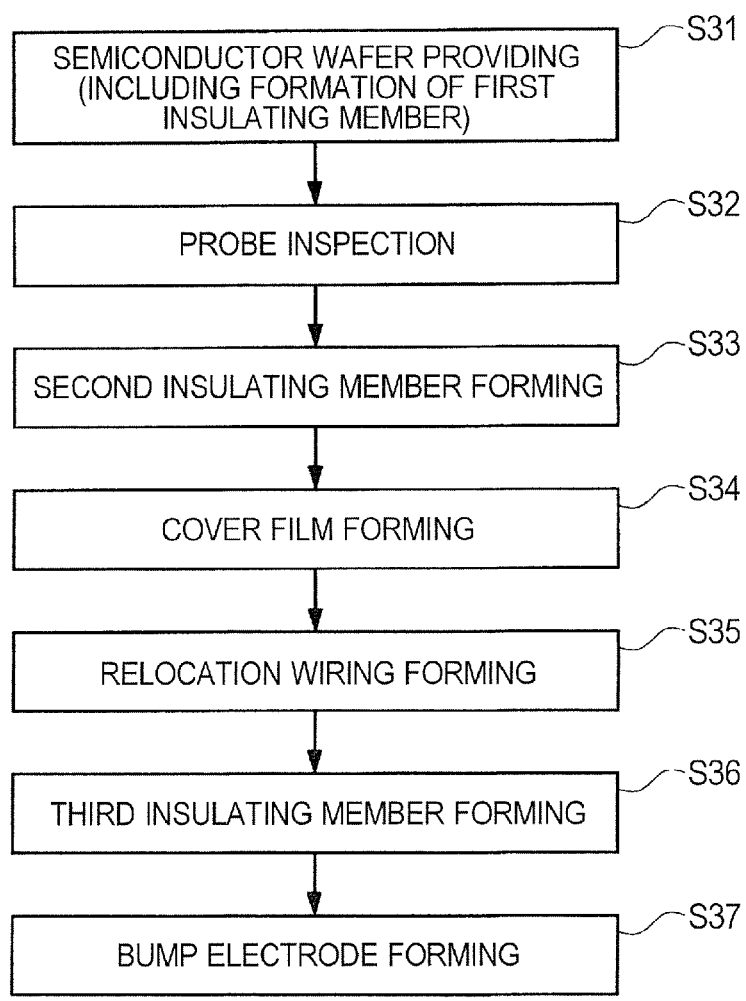
FIG. 19 is a flowchart showing one example of the flow of manufacturing processes in a manufacturing method of a semiconductor device according to a third modified example.

A semiconductor device according to a third modified example will be described below with reference to FIGS. 19, 20A, 20B, 21A, and 21B. Like the modified examples 1 and 2, only different points from the contents described in the above-mentioned embodiments will be described. FIG. 19 is a flowchart showing one example of the flow of manufacturing processes in a manufacturing method of the semiconductor device in the third modified example. FIGS. 20A and 21A, and 20B and 21B are enlarged plan views and enlarged cross-sectional views, respectively, each showing a main part of the semiconductor device obtained in the corresponding manufacturing process for the semiconductor device in the third modified example.

In the third modified example, the semiconductor device without having the memory circuit will be described below. In the semiconductor device with the above-mentioned memory circuit, to avoid the loss of data written in the memory circuit, as shown in FIGS. 7A and 7B, the second insulating member OL is first hardened by the heat treatment, for example, at a temperature of about 300° C. to 400° C., and then the data is written in the memory circuit.

On the other hand, in the third modified example, the data does not need to be written in the memory circuit. For this reason, even if the heat treatment is performed to carry out the process for forming the second insulating member OL, the data loss never occurs. Thus, in this case, as shown in FIG. 19, after forming the electrode pads EP over the main surface of the semiconductor wafer SW, the probe needle PN can be brought into contact with the electrode pad EP, thereby performing the probe inspection.

In the manufacturing method of the semiconductor device in the third modified example, the same process as that in the semiconductor wafer provision step (step S1 shown in FIG. 3) shown in FIGS. 5A and 5B is performed, and then the following steps are to be performed.

2. Probe Inspection (Step S32)

Figure 20A:
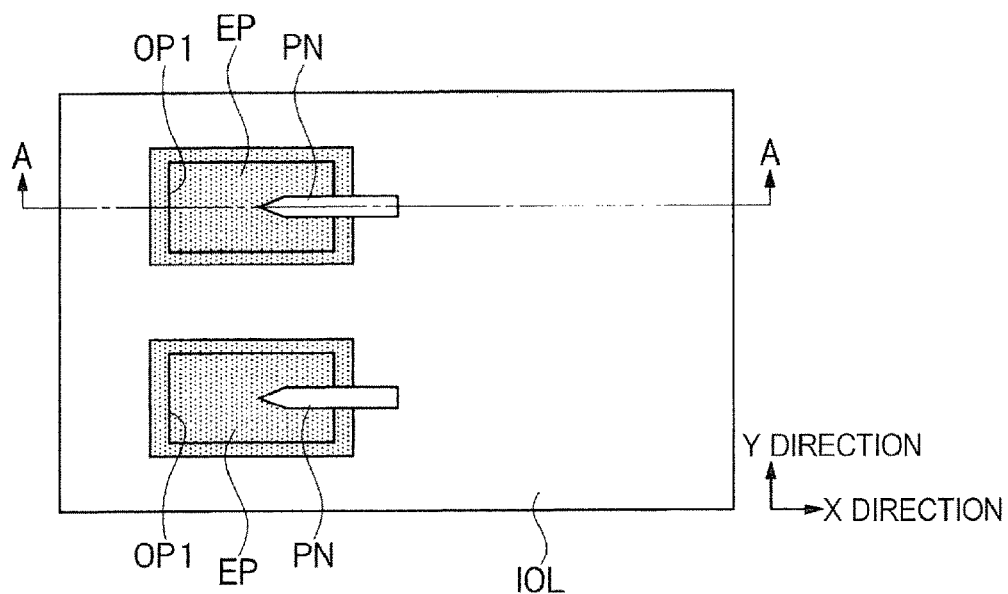
FIGS. 20A and 20B are an enlarged plan view and an enlarged cross-sectional view, respectively, showing a main part of the semiconductor device obtained in one manufacturing process for the semiconductor device in the third modified example.
Figure 20B:
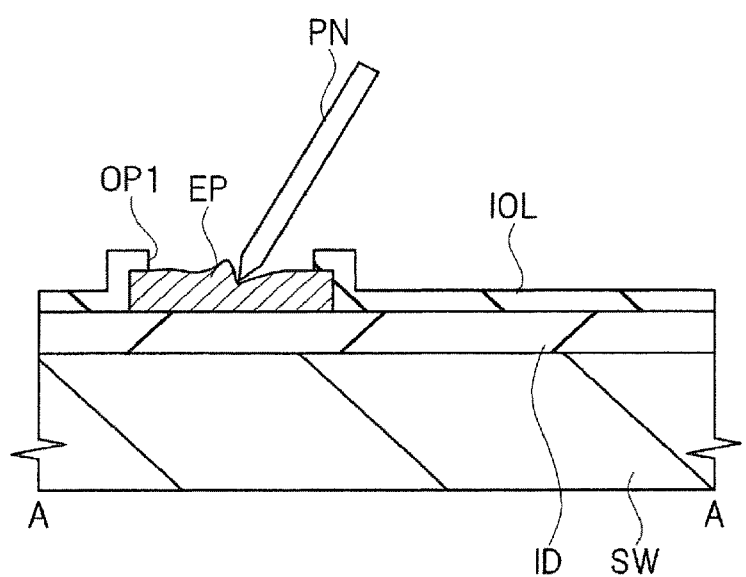

As shown in FIGS. 20A and 20B, the probe needle PN is brought into contact with the electrode pad EP, thereby carrying out the probe inspection. For example, the electrical characteristics and the like of the semiconductor circuit are measured.

The probe needle PN is made of hard metal, such as tungsten (W). The tip of the probe needle PN is so sharp that a probe mark can occur at the surface of the electrode pad EP that includes an aluminum (Al) film as the main conductive layer.

3. Second Insulating Member Formation (Step S33)

Figure 21A:
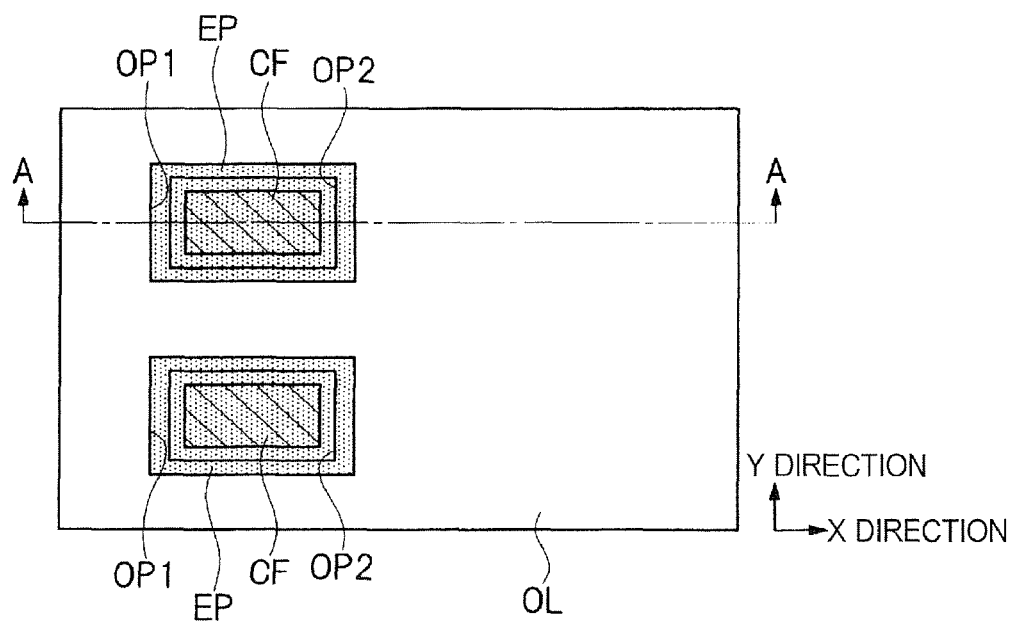
FIGS. 21A and 21B are an enlarged plan view and an enlarged cross-sectional view, respectively, showing a main part of the semiconductor device obtained in another manufacturing process for the semiconductor device, following the process of FIGS. 20A and 20B.
Figure 21B:
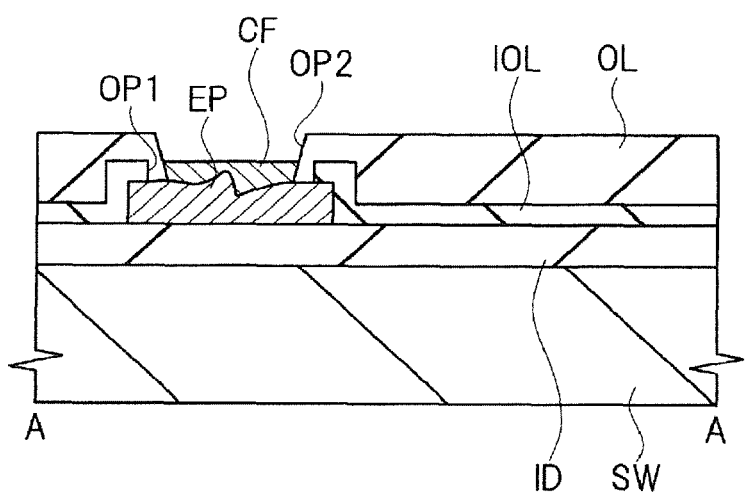

Then, as shown in FIGS. 21A and 21B, the second insulating member OL is formed over the main surface of the semiconductor wafer SW. The second insulating member OL is an organic insulating film, for example, a polyimide film, etc. The organic insulating film is formed, for example, by a rotary coating method. The thickness of the second insulating member OL is, for example, approximately 5 μm.

In the post-process, the relocation wiring RW is formed to be electrically coupled to the electrode pad EP. If the relocation wiring RW is formed directly on the first insulating member IOL, damage (for example, disconnection or cracks) might occur in the relocation wiring RW or a layer positioned under (as a lower layer to) the relocation wiring RW (wiring layer, insulating layer including the first insulating member IOL, etc.) due to stress in mounting (assembly) or in the actual usage environment. Additionally, when the formed first insulating member IOL is thin, it is difficult to maintain the capacity between the wiring positioned under the first insulating member IOL (as a lower layer) and the relocation wiring RW formed over the first insulating member OL, which might not possibly achieve the desired electrical characteristics due to the influence of noise. To avoid these states, the second insulating member OL is formed over the first insulating member IOL.

Then, the second insulating member OL is etched using a resist pattern formed by a lithography technique as a mask (not shown) to thereby form the openings OP2 that expose the upper surfaces of the electrode pads EP therefrom. Subsequently, the semiconductor wafer SW is subjected to a heat treatment at a temperature, for example, of approximately 300° C. to 400° C., thereby hardening the second insulating member OL.

Here, as a different point from the above-mentioned embodiments, in the third modified example, as shown in FIGS. 21A and 21B, the opening end of the opening OP2 of the second insulating member OL is positioned inside the opening end of the opening OP1 of the first insulating member OL. As mentioned above, in the third modified example, since the semiconductor device does not have the memory circuit, after the probe process for the electrical test, the second insulating member OL can be formed, in other words, the heat treatment can be applied. That is, in the manufacturing method of the semiconductor device in the third modified example, after forming the second insulating member OL, the probe process is not performed, so that the opening end of the opening OP2 of the semi-transparent second insulating member OL can be positioned inside the opening end of the opening OP1 of the first insulating member IOL.

As illustrated in FIGS. 21A and 21B, the opening end of the opening OP2 of the second insulating member OL is positioned on the inner side of the opening end of the opening OP1 of the first insulating member IOL, so that the pitch (interval) between the adjacent electrode pads EP can be made narrower.

Thereafter, the same processes as those from the cover film formation step (step S4 shown in FIG. 3) to the bump electrode formation step (step S7 shown in FIG. 3) are performed as shown in FIGS. 8A and 8B to 12A and 12B.

Although not shown, like the third modified example, when the opening end of the opening OP2 of the second insulating member OL is positioned inside the opening end of the opening OP1 of the first insulating member IOL, the width $L_{RW}$ of the relocation wiring RW in the Y direction (in the direction along the side of the semiconductor chip) is preferably the same or smaller than the width $L_{OP1}$ of the opening OP1 formed in the second insulating member OL, preferably, the width (length) of the cover film CF.

Fourth Modified Example

Figure 22:
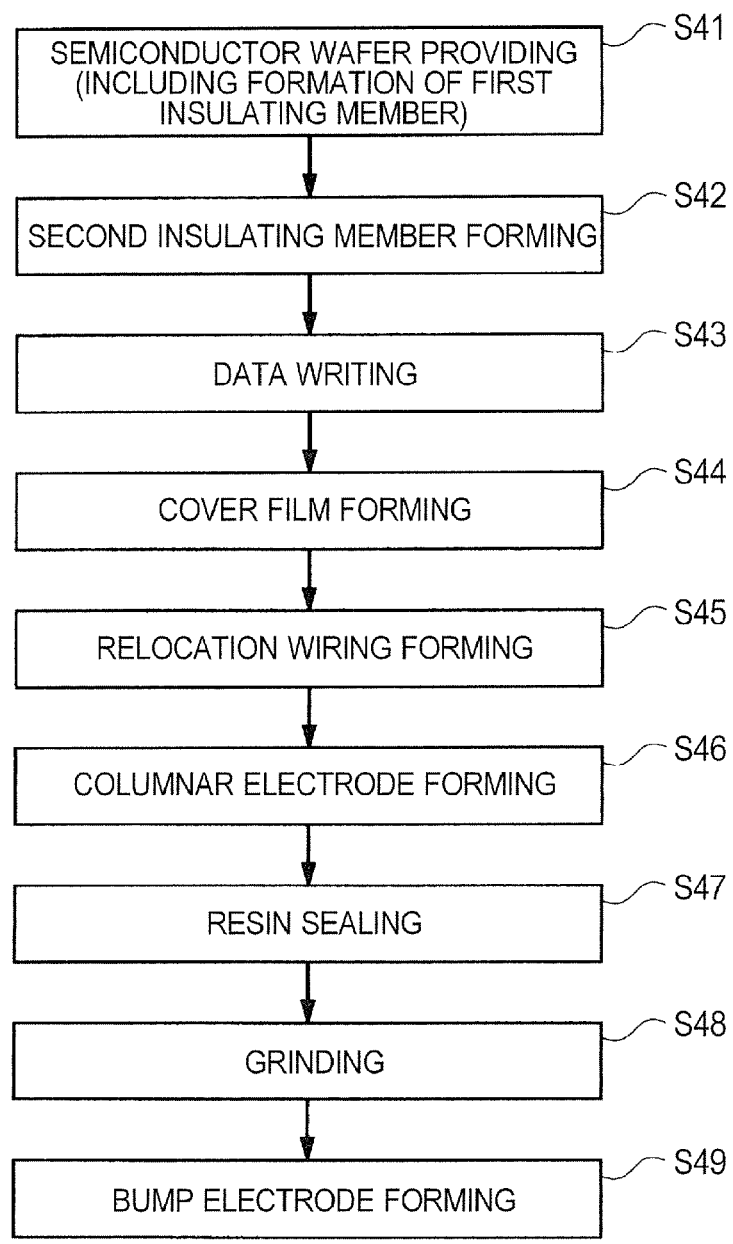
FIG. 22 is a flowchart showing one example of the flow of manufacturing processes in a manufacturing method of a semiconductor device according to a fourth modified example.
Figure 23A:
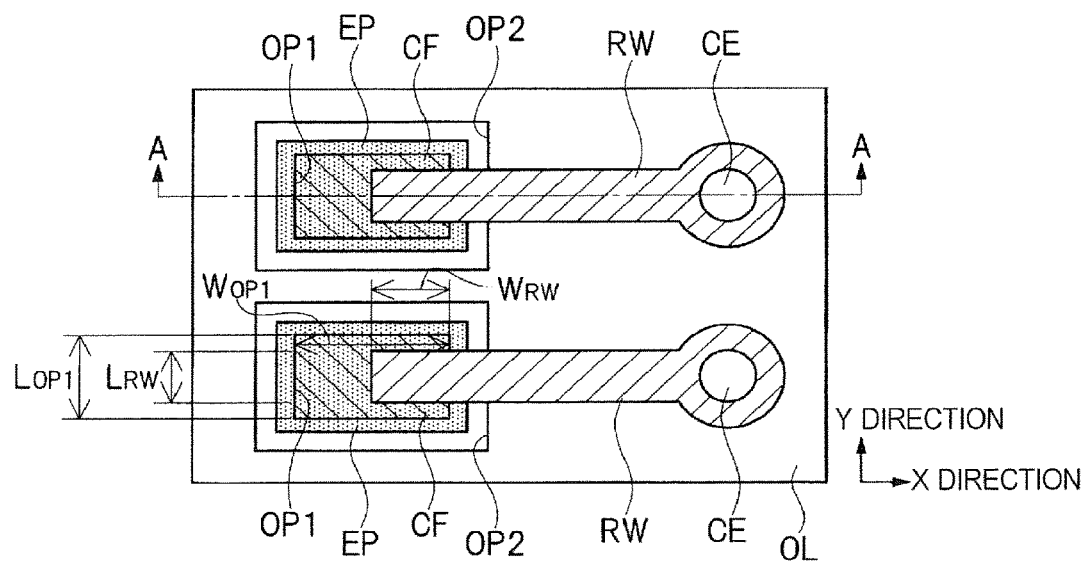
FIGS. 23A and 23B are an enlarged plan view and an enlarged cross-sectional view, respectively, showing a main part of the semiconductor device obtained in one manufacturing process for the semiconductor device in the fourth modified example.
Figure 23B:
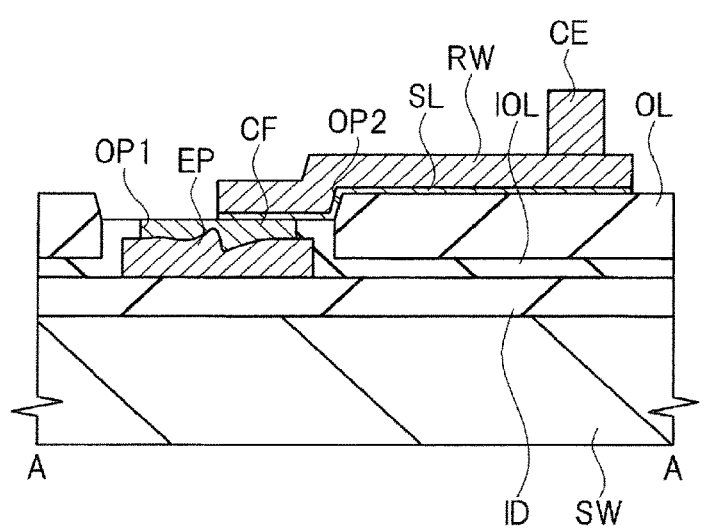
Figure 24A:
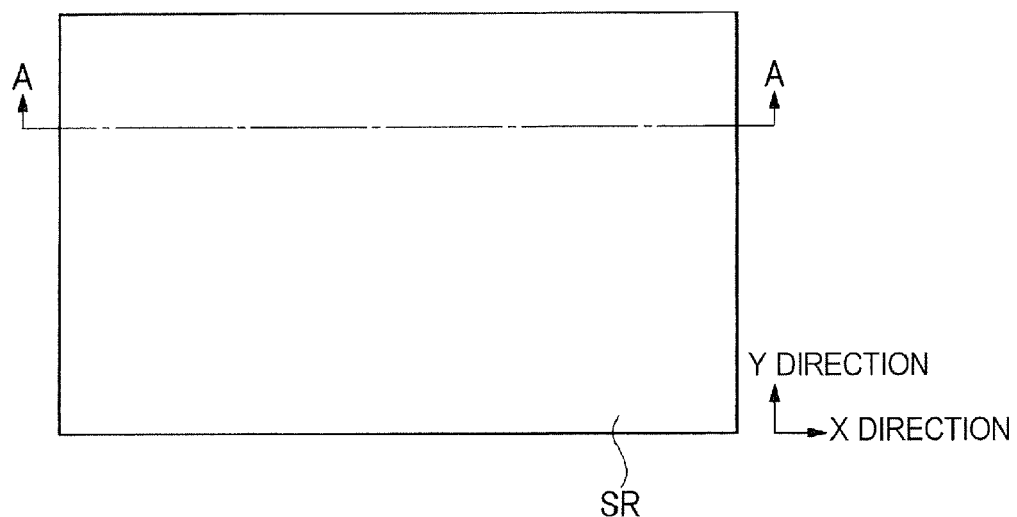
FIGS. 24A and 24B are an enlarged plan view and an enlarged cross-sectional view, respectively, showing a main part of the semiconductor device obtained in another manufacturing process for the semiconductor device, following the process of FIGS. 23A and 23B.
Figure 24B:
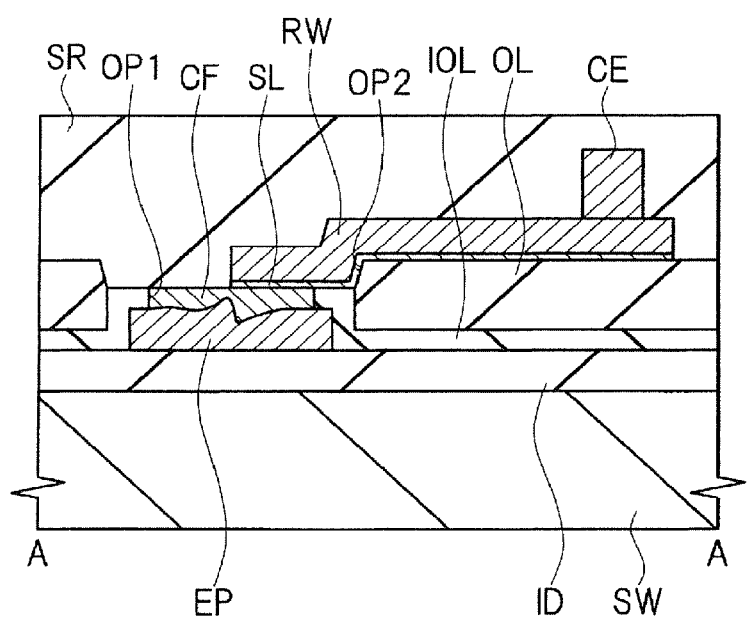
Figure 25A:
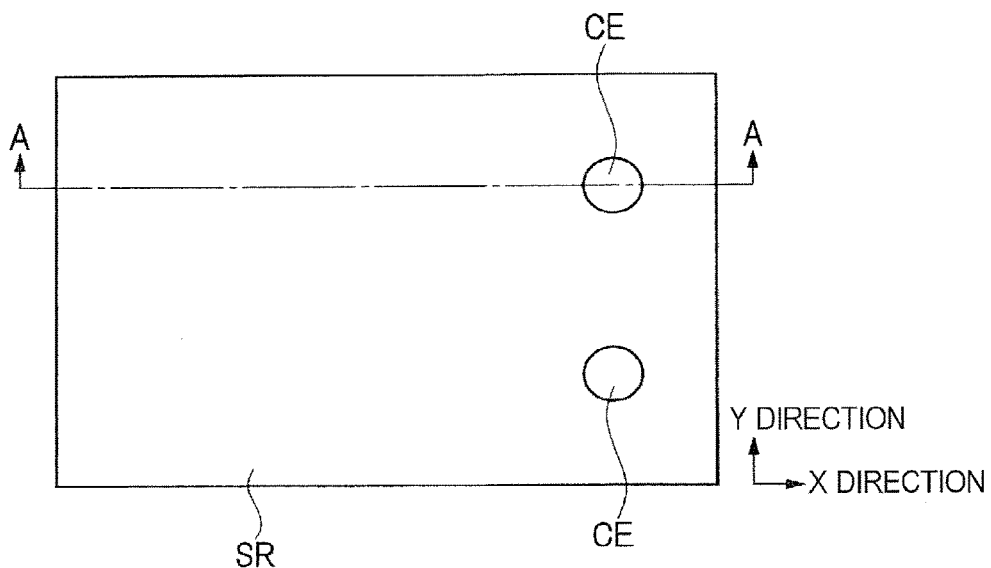
FIGS. 25A and 25B are an enlarged plan view and an enlarged cross-sectional view, respectively, showing a main part of the semiconductor device obtained in another manufacturing process for the semiconductor device, following the process of FIGS. 24A and 24B.
Figure 25B:
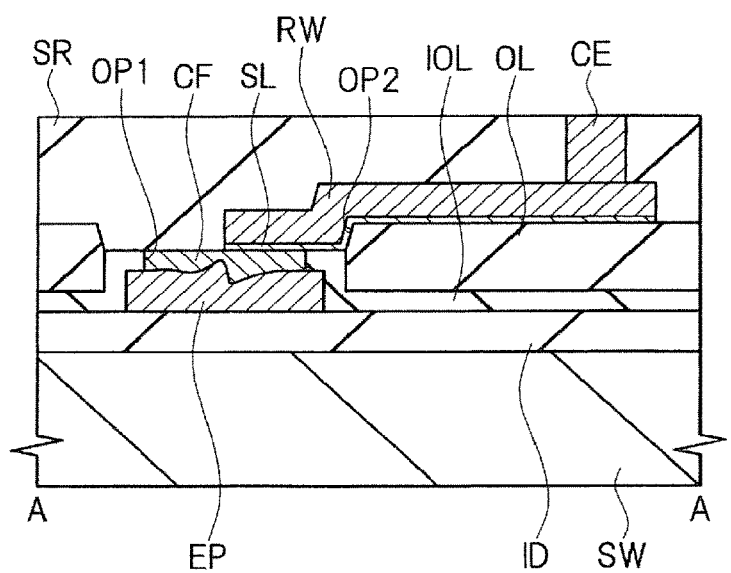
Figure 26A:
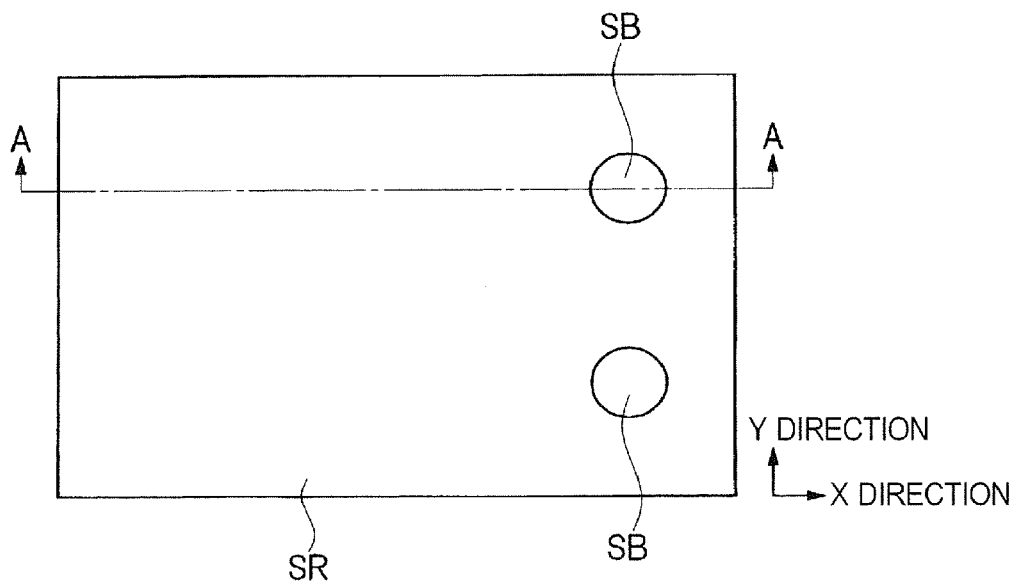
FIGS. 26A and 26B are an enlarged plan view and an enlarged cross-sectional view, respectively, showing a main part of the semiconductor device obtained in another manufacturing process for the semiconductor device, following the process of FIGS. 25A and 25B.
Figure 26B:
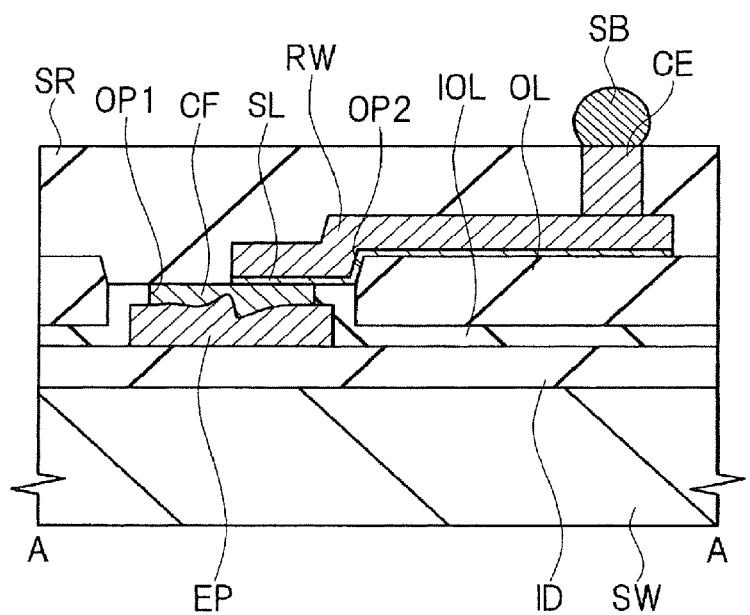

A semiconductor device according to a fourth modified example will be described below with reference to FIGS. 22 to 26A and 26B. Note that like the first to third modified examples, only different points from the contents described in the above-mentioned embodiment will be described. FIG. 22 is a flowchart showing one example of the flow of manufacturing processes in a manufacturing method of the semiconductor device in the fourth modified example. FIGS. 23A and 26A to 23B and 26B are enlarged plan views and enlarged cross-sectional views, respectively, each showing a main part of the semiconductor device obtained in the corresponding manufacturing process for the semiconductor device in the fourth modified example. FIGS. 23A and 23B are a plan view and a cross-sectional view, respectively, for explaining a main part of a columnar electrode formation step (step S46). FIGS. 24A and 24B are a plan view and a cross-sectional view, respectively, for explaining a main part of a resin sealing step (step S47). FIGS. 25A and 25B are a plan view and a cross-sectional view, respectively, for explaining a main part of a grinding step (step S48). FIGS. 26A and 26B are a plan view and a cross-sectional view, respectively, for explaining a main part of a bump electrode formation step (step S49).

In the manufacturing method of the semiconductor device in the fourth modified example, the same processes as those from the semiconductor wafer provision step (step S1 shown in FIG. 3) to the relocation wiring formation step (step S5 shown in FIG. 3) are performed as described in the above-mentioned embodiments, and further the following steps are to be performed.

6. Columnar Electrode Formation (Step S46)

First, as shown in FIGS. 23A and 23B, the columnar electrodes (conductive members) CE are formed over parts of the relocation wirings RW located over the second insulating member OL. The columnar electrode CE is formed, for example, by the following manufacturing method. First, after covering the relocation wiring RW and the second insulting member OL with an insulating member, openings are provided in the insulating member at positions where the columnar electrodes CE are to be formed. Then, the columnar electrode CE is formed in each opening formed in the insulating member by the electrolytic plating, the sputtering, or the like. Thereafter, the insulating member used as a mask is removed to thereby form the columnar electrodes CE shown in FIGS. 23A and 23B.

7. Resin Sealing (Step S47)

Next, as shown in FIGS. 24A and 24B, the third insulating member SR covers the surfaces of the columnar electrodes CE, the relocation wirings RW, and the second insulating member OL. Specific materials for the third insulating member SR used in the fourth modified example include resin, particularly, a thermosetting epoxy resin containing, for example, fillers (e.g., silica).

8. Grinding (Step S48)

Then, as shown in FIGS. 25A and 25B, the third insulating member SR is ground until a part (surface) of the columnar electrode CE is exposed, thereby forming a sealing body comprised of the third insulating member SR.

9. Bump Electrode Formation (Step S49)

Then, as shown in FIGS. 26A and 26B, the bump electrode SB is coupled to a part (surface) of each columnar electrode CE exposed in the above-mentioned grinding step. At this time, the electrode layer (electrode) UM preferably intervenes between the bump electrode SB and the columnar electrode CE in terms of coupling therebetween as mentioned in the above embodiment.

Fifth Modified Example

Figure 27:
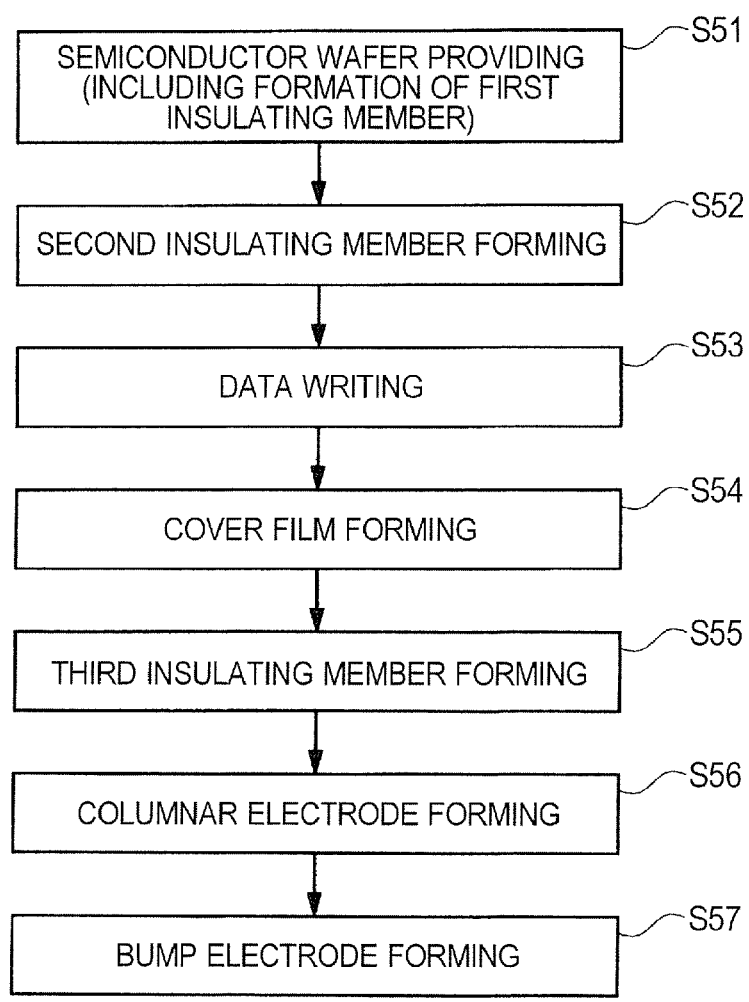
FIG. 27 is a flowchart showing one example of the flow of manufacturing processes in a manufacturing method of a semiconductor device according to a fifth modified example.
Figure 28A:
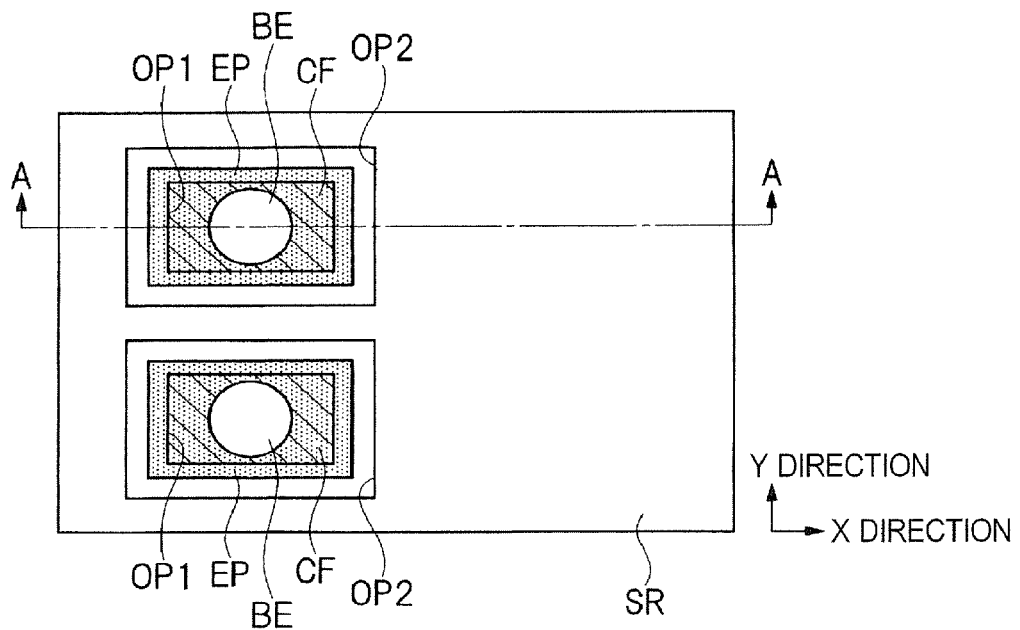
FIG. 28A is an enlarged plan view showing a main part of the semiconductor device in the fifth modified example (which is a translucent plan view through a protective film (third insulating member) at the uppermost surface.
Figure 28B:
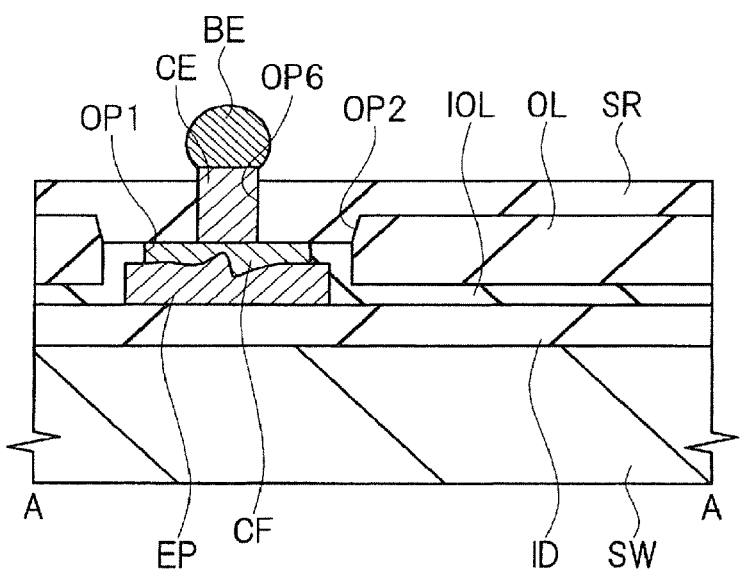
FIG. 28B is a cross-sectional view of the main part taken along the line A-A of FIG. 28A.

A semiconductor device according to a fifth modified example will be described below with reference to FIGS. 27 and 28A and 28B. Note that like the first to fourth modified examples, only different points from the contents described in the above-mentioned embodiment will be described. FIG. 27 is a flowchart showing one example of the flow of manufacturing processes in a manufacturing method of the semiconductor device in the fifth modified example. FIGS. 28A and 28B are an enlarged plan view and an enlarged cross-sectional view, respectively, showing a main part of the semiconductor device obtained in one manufacturing process for the semiconductor device in the fifth modified example. FIG. 28A is a transparent plan view through the insulating member (third insulating member) covering the relocation wirings, as viewed from the main surface side of the semiconductor wafer. FIG. 28B is a cross-sectional view taken along the line A-A of FIG. 28A.

In the semiconductor device of the fifth modified example, the bump electrode is formed directly above the electrode pad without forming any relocation wirings. In the manufacturing method of the semiconductor device in the fifth modified example, the same processes as those from the semiconductor wafer provision step (step S1 shown in FIG. 3) to the cover film formation step (step S4 shown in FIG. 3) described in the above-mentioned embodiments are performed, and further the following steps are to be performed.

5. Third Insulating Member Formation (Step S55)

As shown in FIGS. 28A and 28B, the third insulating member SR is formed over the main surface of the semiconductor wafer SW.

Then, the third insulating member SR is etched using the resist pattern formed by the lithography as a mask (not shown) to thereby form openings OP6 that expose the upper surfaces of the cover films CF.

6. Columnar Electrode Formation (Step S56)

Then, the columnar electrode (conductive member) CE to be coupled to the upper surface of the cover film CF is formed within each opening OP6 formed in the third insulating member SR.

7. Bump Electrode Formation (Step S57)

Next, bump electrodes BE made of solder are formed to be coupled to the respective columnar electrodes CE.

After forming the openings OP6 in the third insulating member SR, the bump electrodes BE can be formed directly on the respective electrode pads EP. In the fifth modified example, however, the cover film CF and the columnar electrode CE are formed between the electrode pad EP and the bump electrode BE, so that the coupling strength can be improved, compared to when the bump electrode BE is formed directly on the electrode pad EP.

Even when being arranged directly above the electrode pad EP, the bump electrode BE can be formed to have a small diameter, to protrude high from the upper surface of the third insulating member SR, and to have the high coupling strength. Thus, the semiconductor device can be achieved that has the high reliability and is adaptable to achieve the pitch reduction.

Sixth Modified Example

Figure 29:
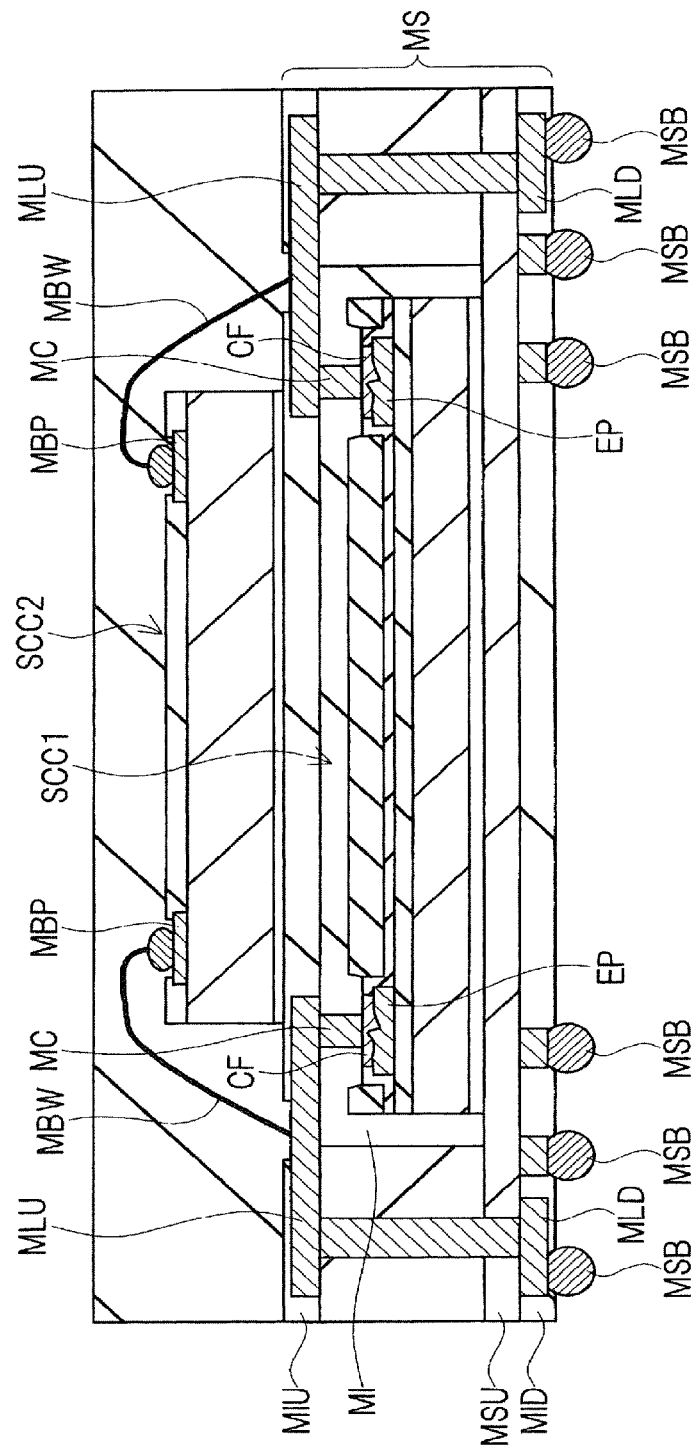
FIG. 29 is a cross-sectional view showing a main part of a semiconductor device according to a sixth modified example.

A semiconductor device according to a sixth modified example will be described below with reference to FIG. 29. Like the modified examples 1 to 5, only different points from the contents described in the above-mentioned embodiments will be described below. FIG. 29 shows a cross-sectional view of a main part of the semiconductor device that is formed by singulating the semiconductor wafer subjected to the processes up to the cover film formation step (step S4 shown in FIG. 3) as described in the above-mentioned embodiments, to obtain the semiconductor chips, and then embedding the semiconductor chip in the wiring board.

The semiconductor device in the sixth modified example will be manufactured, for example, in the following steps.

First, the semiconductor wafer subjected to the processes up to the cover film formation step (step S4 shown in FIG. 3) as described in the above-mentioned embodiments is singulated to provide a semiconductor chips SCC1.

Then, as shown in FIG. 29, the thus-obtained semiconductor chip SCC1 is arranged at the upper surface of a substrate MSU, and then sealed with an insulating material MI. The insulating material MI used at this time is, for example, glass fiber impregnated with epoxy resin. Alternatively, the same material as that for the third insulating member described above, for example, the polyimide film may be used. In this way, a wiring board MS with the semiconductor chip SCC1 embedded therein is formed.

Then, by irradiating the insulating material MI with a laser light, an opening that exposes therein a part (surface) of the cover film CF is formed, and a conductive member MC is embedded in the opening. The conductive member MC used at this time includes the same material as that configuring the wiring (wiring pattern) formed in each wiring layer of the wiring board MS. For example, the conductive member MC is made of copper (Cu).

The cover film CF is made, for example, of nickel (Ni) as mentioned in the above embodiments. Thus, as shown in FIG. 29, the cover film CF is formed over the electrode pad EP made of aluminum (Al), which can reduce the damage to the electrode pad EP, compared to when the electrode pad EP is directly irradiated with the laser light.

As described in the above fifth modified example, the columnar electrodes CE may be preferably formed over the cover film CF in terms of coupling the wiring board MS with the wiring. By forming the columnar electrode CE directly on the electrode pad EP, it is easier to determine if the laser light reaches a target position (here, the surface of the columnar electrode) when removing the insulating material MI by irradiation with the laser light.

Then, after filling the inside of the opening formed in the insulating material MI with the conductive member MC, a wiring MLU is formed (coupled) and covered with a protective film MIU. Apart (a part of the wiring MLU) is exposed from the protective film MIU so as to be electrically coupled to an electrode pad MBP (electrode, bonding lead) of another semiconductor chip SCC2 mounted on the wiring board MS via the conductive member (here, conductive wire) MBW in the post-process. On the lower surface (mounting surface) side of the wiring substrate MS, the wiring MLD formed at the lower surface on the opposite side to the upper surface of the substrate MSU is also coated by the protective film MID. Then, parts (parts of the wirings MLD) coupled to the solder balls MSB serving as external terminals are exposed from the protective film MID in the following process.

Then, for example, after mounting the semiconductor chip SCC2 in the chip mounting region of the wiring board MS in the same way as the above-mentioned second modified example, on the upper surface side of the wiring board MS, the electrode pad MBP of the semiconductor chip SCC2 is coupled to a part of the wiring MLU exposed from the protective film MIU using a conductive member MBW. On the lower surface side of the wiring board MS, a solder ball MSB is coupled to apart of the wiring MLD exposed from the protective film MID. In this way, the semiconductor device in the sixth modified example is substantially completed.

As mentioned above, the BGA (Ball Grid Array) can be manufactured by using the wiring board MS with the semiconductor chip SCC1 embedded therein, achieving the semiconductor device with the higher functionality.

The electrical coupling with the other semiconductor chip SCC2 mounted over the wiring board MS may be performed not only by the conductive wire, but also with the so-called flip-chip coupling, which involves placing the main surface (surface with the electrode pad MBP) of the other semiconductor chip SCC2 to face the wiring board MS. Further, for example, another semiconductor chip may be mounted (laminated) over the other semiconductor chip shown in FIG. 29.

Seventh Modified Example

Further, a combination of the modified examples can be applied without departing from the scope of the technical idea described in the embodiments.

What is claimed is:
1. A method of manufacturing a semiconductor device, comprising:
   (a) providing a semiconductor wafer including:
      a main surface,
      a first electrode pad formed over the main surface,
      a second electrode pad formed over the main surface and arranged next to the first electrode pad in plan view, and
      a first insulating member including a first opening that exposes an upper surface of the first electrode pad and a second opening that exposes an upper surface of the second electrode pad;
   (b) after (a), forming a second insulating member over the first insulating member of the semiconductor wafer, and forming a third opening that exposes the upper surface of the first electrode pad and a fourth opening that exposes the upper surface of the second electrode pad, in the second insulating member;
   (c) after (b), within the third opening and the fourth opening, covering the upper surface of the first electrode pad and the upper surface of the second electrode pad with a first cover film and a second cover film, respectively;
   (d) after (c), bringing probe needles into contact with the first and second cover films, respectively, thereby writing data in a memory circuit of the semiconductor wafer;
   (e) after (d), forming a first wiring and a second wiring over a surface of the first cover film and a surface of the second cover film, respectively; and
   (f) after (e), covering the surface of the first cover film, the surface of the second cover film, the first wiring and the second wiring with a third insulating member, and forming a fifth opening that exposes a first part of the first wiring and a sixth opening that exposes a first part of the second wiring, in the third insulating member,
   wherein, in plan view, the first electrode pad and the second electrode pad are arranged along a first direction,
   wherein each of the first cover film and the second cover film is comprised of a conductive material,
   wherein the first part of the first wiring is located outside of the third opening in plan view and is formed over the second insulating member,
   wherein the first wiring has a second part located within the third opening in plan view,
   wherein the first part of the second wiring is located outside of the fourth opening in plan view and is formed over the second insulating member,
   wherein the second wiring has a second part located within the fourth opening in plan view,
   wherein, in plan view, a width of the second part of the first wiring in the first direction is equal to or smaller than a width of the third opening formed in the second insulating member,
   wherein, in plan view, a width of the second part of the second wiring in the first direction is equal to or smaller than a width of the fourth opening formed in the second insulating member, and
   wherein in (b), a heat treatment is performed.

2. The method of manufacturing a semiconductor device according to claim 1,
   wherein an opening end of the first opening formed in the first insulating member is positioned within an opening end of the third opening formed in the second insulating member, and
   wherein an opening end of the second opening formed in the first insulating member is positioned within an opening end of the fourth opening formed in the second insulating member.

3. The method of manufacturing a semiconductor device according to claim 1,
   wherein the first insulating member has a first elastic modulus, and the second insulating member has a second elastic modulus lower than the first elastic modulus.

4. The method of manufacturing a semiconductor device according to claim 1,
   wherein the first insulating member is an inorganic insulating film, and the second insulating member is an organic insulating film.

5. The method of manufacturing a semiconductor device according to claim 1,
   wherein the first cover film and/or the second cover film is a laminated film including a nickel film.

6. The method of manufacturing a semiconductor device according to claim 1,
wherein (e) comprises:
(e1) forming a first seed layer at the surface of the first cover film and the surface of the second insulating member, and a second seed layer at the surface of the second cover film;
(e2) forming the first wiring and the second wiring on the first seed layer and the second seed layer, respectively; and
(e3) removing a part of the first seed layer not overlapping with the first wiring, and a part of the second seed layer not overlapping with the second wiring.

7. The method of manufacturing a semiconductor device according to claim 1, further comprising:
(h) after (e), electrically coupling respective bump electrodes to the first part of the first wiring exposed from the fifth opening and the first part of the second wiring exposed from the sixth opening.

8. The method of manufacturing a semiconductor device according to claim 1, further comprising, after (f):

(i) cutting the semiconductor wafer along a scribe region between partitioned device regions, thereby obtaining a plurality of semiconductor chips;
(j) fixing one of the plurality of semiconductor chips in a chip mounting region of a wiring board; and
(k) for said one of the plurality of semiconductor chips, electrically coupling the first part of the first wiring exposed from the fifth opening, the first part of the second wiring exposed from the sixth opening, and a plurality of electrodes formed around the chip mounting region of the wiring board to one another using conductive material.

9. The method of manufacturing a semiconductor device according to claim 1,
wherein, in plan view, a width of the first part of the first wiring is larger than the width of the second part of the first wiring, and
wherein, in plan view, a width of the first part of the second wiring is larger than the width of the second part of the second wiring.

* * * * *